A method of manufacturing an integrated fan-out (InFO) package includes at least the following steps. A package array is formed. A dielectric layer and a core material layer are sequentially formed on a first carrier. A portion of the core material layer is removed to form a core layer having a plurality of cavities. The first carrier, the dielectric layer, and the core layer are attached onto the package array such that the core layer is located between the dielectric layer and the package array. The first carrier is removed from the dielectric layer. A plurality of first conductive patches is formed on the dielectric layer above the cavities.

United States Patent
Wan et al.

(10) Patent No.: US 10,366,966 B1
(45) Date of Patent: Jul. 30, 2019

(54) METHOD OF MANUFACTURING INTEGRATED FAN-OUT PACKAGE

(71) Applicant: Taiwan Semiconductor Manufacturing Co., Ltd., Hsinchu (TW)

(72) Inventors: Albert Wan, Hsinchu (TW); Ching-Hua Hsieh, Hsinchu (TW); Chung-Hao Tsai, Changhua County (TW); Chuei-Tang Wang, Taichung (TW); Chao-Wen Shih, Hsinchu County (TW); Han-Ping Pu, Taichung (TW); Chien-Ling Hwang, Hsinchu (TW); Pei-Hsuan Lee, Tainan (TW); Tzu-Chun Tang, Kaohsiung (TW); Yu-Ting Chiu, Hsinchu County (TW); Jui-Chang Kuo, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/981,929

(22) Filed: May 17, 2018

(51) Int. Cl.
H01L 21/56 (2006.01)
H01L 23/00 (2006.01)
H01L 23/538 (2006.01)
H01L 21/768 (2006.01)
H01L 21/48 (2006.01)
(Continued)

(52) U.S. Cl.
CPC ............ *H01L 24/94* (2013.01); *H01L 21/481* (2013.01); *H01L 21/486* (2013.01); *H01L 21/568* (2013.01); *H01L 21/76802* (2013.01); *H01L 21/76877* (2013.01); *H01L 23/315* (2013.01); *H01L 23/3121* (2013.01); *H01L 23/5384* (2013.01); *H01L 23/5389* (2013.01); *H01L 23/66* (2013.01); *H01L 24/03* (2013.01); *H01L 24/05* (2013.01); *H01L 24/14* (2013.01); *H01L 25/0655* (2013.01); *H01L 25/50* (2013.01); *H01L 2224/03003* (2013.01);
(Continued)

(58) Field of Classification Search
CPC ... H01L 21/481; H01L 21/486; H01L 21/568; H01L 25/50; H01L 25/0655; H01L 23/3121; H01L 23/315; H01L 23/5389; H01L 24/03; H01L 24/05; H01L 24/94; H01L 2224/03003; H01L 2224/05563; H01L 2224/94; H01L 2924/1811
See application file for complete search history.

(56) References Cited

U.S. PATENT DOCUMENTS 6,124,149 A * 9/2000 Paik .................... H01L 25/0657
438/107
9,000,584 B2 4/2015 Lin et al.
(Continued)

Primary Examiner — Stephen W Smoot
(74) Attorney, Agent, or Firm — JCIPRNET

(57) ABSTRACT

20 Claims, 28 Drawing Sheets

(51) Int. Cl.
  *H01L 23/66* (2006.01)
  *H01L 25/00* (2006.01)
  *H01L 25/065* (2006.01)
  *H01L 23/31* (2006.01)

(52) U.S. Cl.
  CPC .................. *H01L 2224/05563* (2013.01); *H01L 2224/94* (2013.01); *H01L 2924/1811* (2013.01)

(56) References Cited

U.S. PATENT DOCUMENTS

| | | |
|---|---|---|
| 9,048,222 B2 * | 6/2015 | Hung .................. H01L 23/481 |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2010/0127396 A1 * | 5/2010 | Tang .................. H01L 23/50 257/773 |
| 2014/0210081 A1 * | 7/2014 | Lin .................. H01L 21/561 257/738 |
| 2016/0167952 A1 * | 6/2016 | Bowles .................. B81B 7/02 257/415 |
| 2017/0033083 A1 * | 2/2017 | Lin .................. H01L 23/49838 |
| 2019/0139890 A1 * | 5/2019 | Lu .................. H01L 23/5226 |
| 2019/0157224 A1 * | 5/2019 | Wan .................. H01L 23/66 |

* cited by examiner

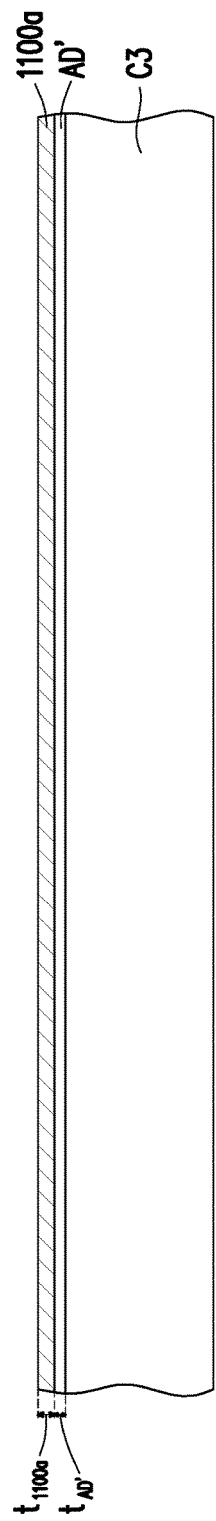
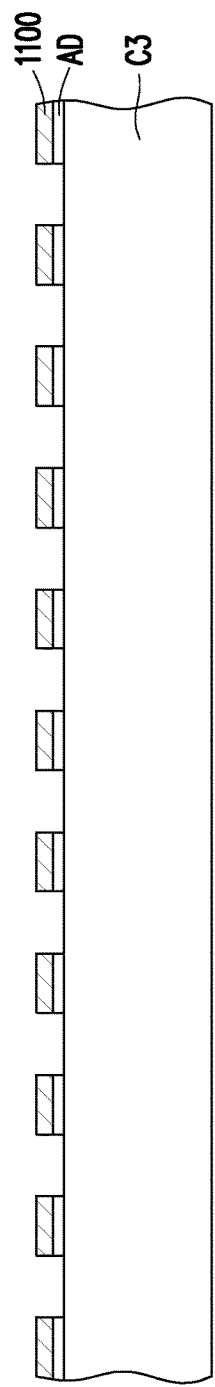
FIG. 1L
FIG. 1M

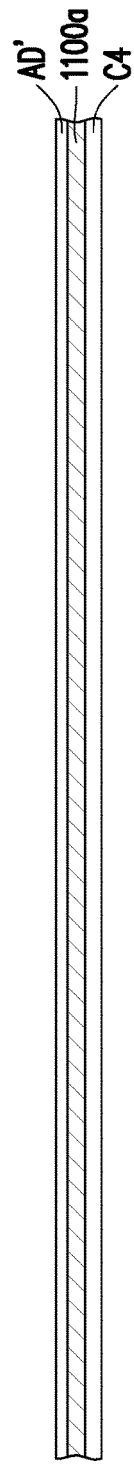
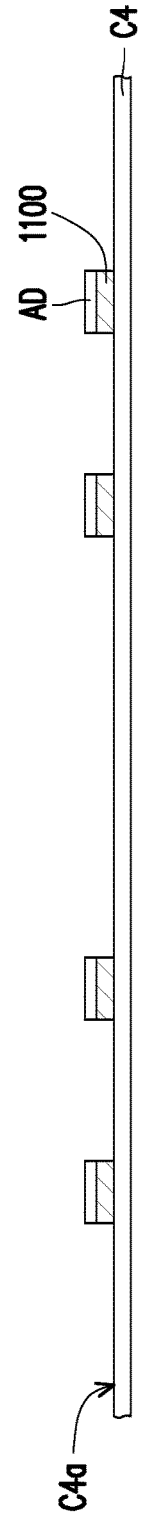
FIG. 3A
FIG. 3B

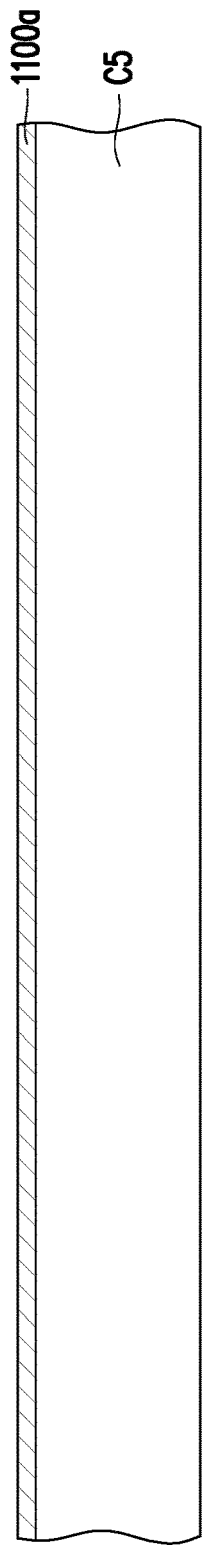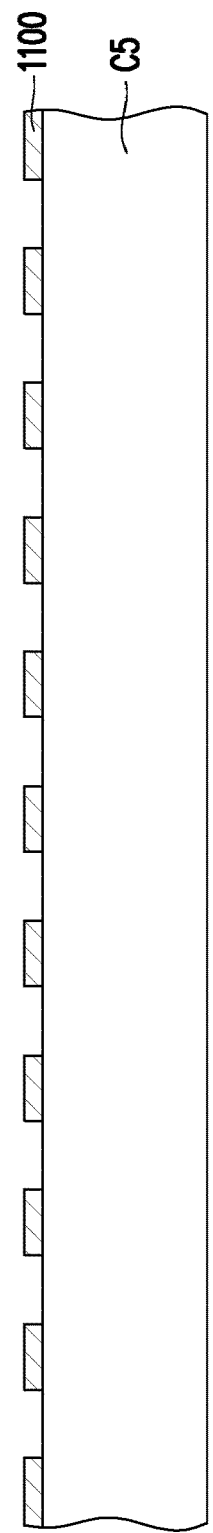
FIG. 4A
FIG. 4B

METHOD OF MANUFACTURING INTEGRATED FAN-OUT PACKAGE

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to FIG. 3D are schematic cross-sectional views illustrating various stages of a manufacturing process of an InFO package in accordance with some alternative embodiments of the disclosure.

FIG. 4A to FIG. 4F are schematic cross-sectional views illustrating various stages of a manufacturing process of an InFO package in accordance with some alternative embodiments of the disclosure.

DETAILED DESCRIPTION

Figure 1A:
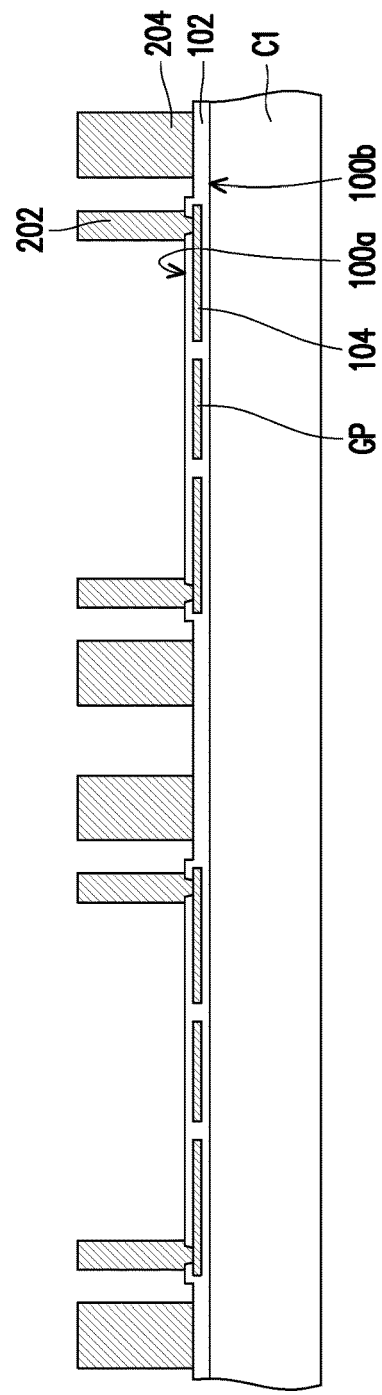
FIG. 1A to FIG. 1O are schematic cross-sectional views illustrating a manufacturing process of an integrated fan-out (InFO) package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1O are schematic cross-sectional views illustrating a manufacturing process of an integrated fan-out (InFO) package in accordance with some embodiments of the disclosure. Referring to FIG. 1A, a carrier C1 is provided. In some embodiments, the carrier C1 is a glass substrate. Subsequently, a first redistribution structure 100 is formed over the carrier C1. In some embodiments, the first redistribution structure 100 includes a first dielectric layer 102, a ground plane GP, and plurality of first conductive patterns 104. The first redistribution structure 100 has a first surface 100a and a second surface 100b opposite to the first surface 100a. At this stage, the first surface 100a faces upward while the second surface 100b faces the carrier C1. In some embodiments, a de-bonding layer (not shown) may be provided between the first dielectric layer 102 and the carrier C1. The de-bonding layer may be a light-to-heat conversion (LTHC) release layer and may aid the removal of the carrier C1 in the subsequent processes. In some embodiments, the first redistribution structure 100 may be referred to as a backside redistribution structure.

In some embodiments, the first dielectric layer 102 may be a polymer layer made of polybenzoxazole (PBO), polyimide (PI), benzocyclobutene (BCB), a combination thereof, or the like. In some embodiments, the first dielectric layer 102 may include multiple dielectric layers. For example, the first redistribution structure 100 may be configured such that the ground plane GP and the first conductive patterns 104 are sandwiched between two adjacent dielectric layers of the first dielectric layer 102. That is, the ground plane GP and the first conductive patterns 104 may be considered as being embedded in the first dielectric layer 102. In some embodiments, the ground plane GP may be electrically connected to a ground. On the other hand, the first conductive patterns 104 may be electrically connected to other subsequently formed conductive elements for signal transmission. The ground plane GP and the first conductive patterns 104 may be formed by a same photolithography and etching process at the same time. In other words, in some embodiments, the ground plane GP and the first conductive patterns 104 may be collectively referred to as a first conductive pattern layer. In some embodiments, the ground plane GP and the first conductive patterns 104 includes copper, nickel, titanium, a combination thereof, or the like. It should be noted that the number of the dielectric layers (the first dielectric layer 102) and/or the first conductive pattern layer (i.e. the ground plane GP and the first conductive patterns 104) is not limited by the illustration presented in FIG. 1A. In some alternative embodiments, more dielectric layers and/or more first conductive pattern layers may be formed to stack alternately.

A plurality of first through interlayer vias (TIV) 202 and a plurality of second TIVs 204 are formed over the first redistribution structure 100. As illustrated in FIG. 1A, the first TIVs 202 are electrically connected to the first conductive patterns 104 and the second TIVs 204 are electrically insulated from the first conductive patterns 104 and the ground plane GP. In some embodiments, the method of forming the first TIVs 202 includes the following steps. First, the first dielectric layer 102 is patterned to form a plurality of openings exposing at least a portion of the first conductive patterns 104. Subsequently, a seed material layer (not shown) is formed over the first dielectric layer 102 and over the first conductive patterns 104 exposed by the openings. In some embodiments, the seed material layer includes a titanium/copper composite layer and is formed by a sputtering process. Thereafter, a photoresist layer (not shown) with openings is formed on the seed material layer. The openings of the photoresist layer expose the intended locations for the subsequently formed TIVs. Afterwards, a plating process is performed to form a metal material layer (e.g., a copper layer) on the seed material layer exposed by the openings of the photoresist layer. The photoresist layer and the underlying seed material layer are then removed to form the first TIVs 202. In some embodiments, the second TIVs 204 may be formed by processes similar to the foregoing steps. However, the disclosure is not limited thereto. In some alternative embodiments, the second TIVs 204 may be formed by pick and place pre-fabricated TIVs onto the first dielectric layer 102. In some embodiments, the second TIVs 204 are arranged to form a plurality of dipole antennas. As illustrated in FIG. 1A, the second TIVs 204 have a dimension (e.g. width) greater than that of the first TIVs 202. However, the disclosure is not limited thereto. In some alternative embodiments, the second TIVs 204 may have a dimension (e.g. width) substantially equal to or less than that of the first TIVs 202. In some embodiments, the second TIVs 204 are optional.

Figure 1B:
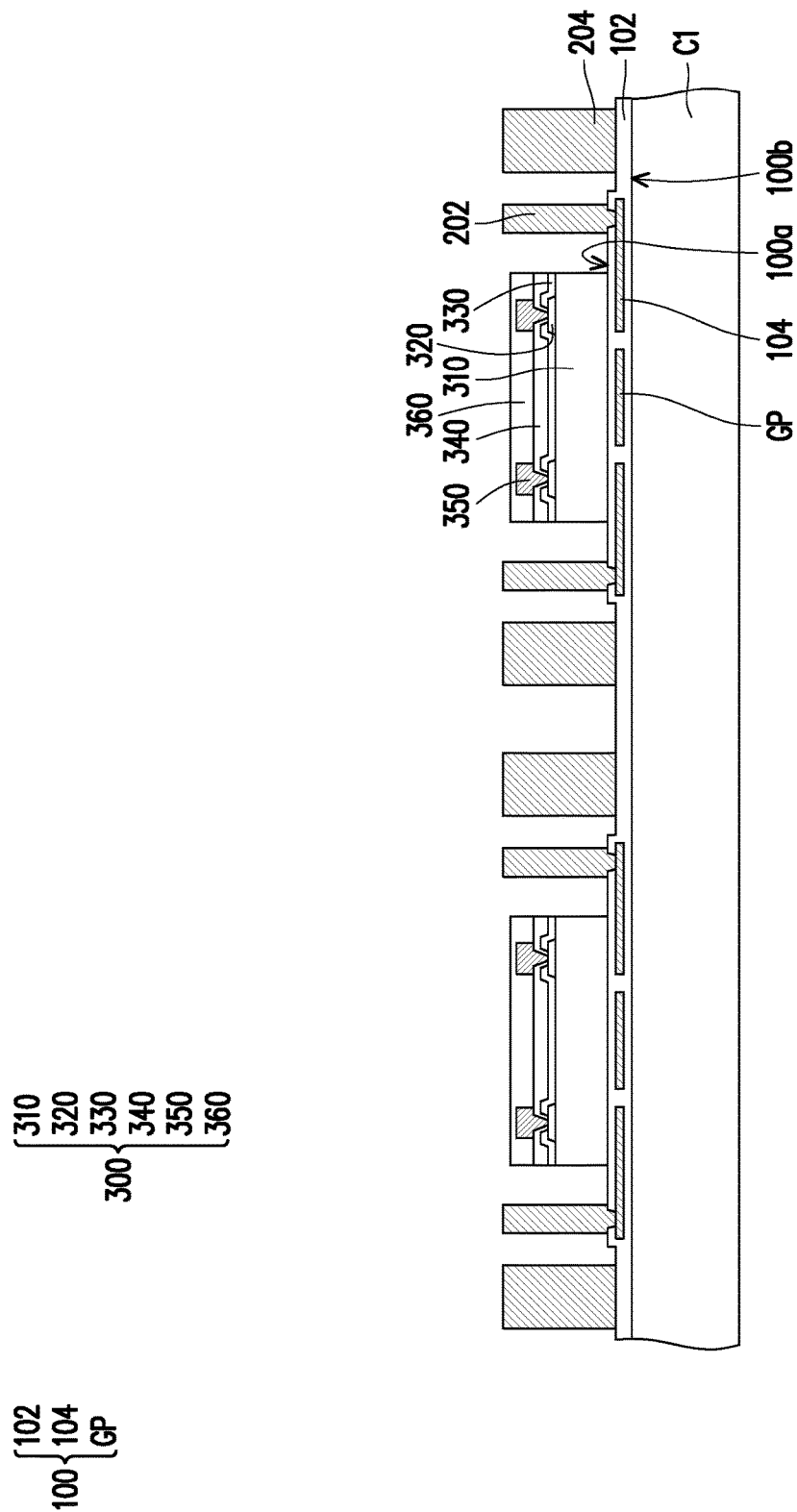

Referring to FIG. 1B, a plurality of dies 300 may be picked and placed onto the first surface 100a of the first redistribution structure 100. That dies 300 are placed such that each die 300 is surrounded by the first TIVs 202 and the second TIVs 204. Each die 300, for example, includes a semiconductor substrate 310, a plurality of conductive pads 320, a passivation layer 330, a post passivation layer 340, a plurality of conductive vias 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors, or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed by the contact openings of the post passivation layer 340. The post-passivation layer 340 may be a PI layer, a PBO layer, or a dielectric layer formed by other suitable polymers. In addition, the conductive vias 350 are formed on the conductive pads 320. In some embodiments, the conductive vias 350 are plated on the conductive pads 320. The protection layer 360 is formed on the post-passivation layer 340 to cover the conductive vias 350.

In some embodiments, the dies 300 are attached (or adhered) on the first dielectric layer 102 through a die attach film (DAF; not shown). In some embodiments, the dies 300 may be picked and placed onto the first dielectric layer 102 after the formation of the first TIVs 202 and/or the second TIVs 204. However, the disclosure is not limited thereto. In some alternative embodiments, the dies 300 may be picked and placed onto the first dielectric layer 102 before the formation of the first TIVs 202 and/or the second TIVs 204.

Figure 1C:
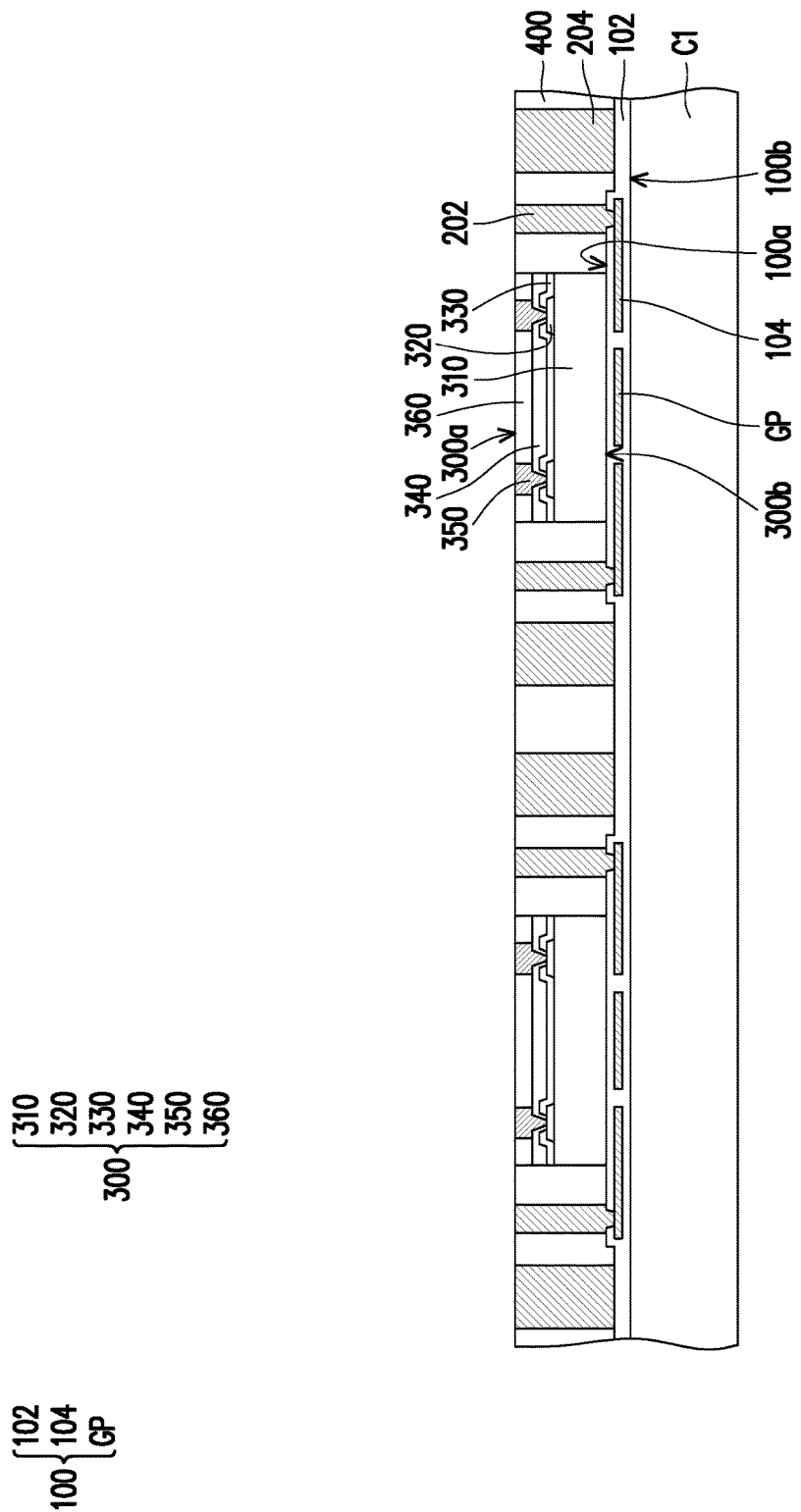

Referring to FIG. 1C, an encapsulant 400 is formed over the first surface 100a of the first redistribution structure 100 to encapsulate the dies 300, the first TIVs 202, and the second TIVs 204. In other words, the dies 300, the first TIVs 202, and the second TIVs 204 are embedded in the encapsulant 400. In some embodiments, the encapsulant 400 includes a molding compound, a molding underfill, a resin (such as epoxy), or the like. In some alternative embodiments, the encapsulant 400 includes a photo-sensitive material such as PBO, PI, BCB, a combination thereof, or the like. In some embodiments, a method of forming the encapsulant 400 includes the following steps. First, an encapsulation material (not shown) is formed on the first dielectric layer 102 through, for example, a compression molding process. The dies 300, the first TIVs 202, and the second TIVs 204 are encapsulated by the encapsulation material. In other words, the conductive vias 350 and the protection layer 360 of the dies 300 are not revealed and are well protected by the encapsulation material. Thereafter, the encapsulation material is grinded until top surfaces of the conductive vias 350, top surfaces of the first TIVs 202, and top surfaces of the second TIVs 204 are exposed, so as to form the encapsulant 400. In some embodiments, the encapsulant material is grinded by a mechanical grinding process and/or a chemical mechanical polishing (CMP) process. In some embodiments, during the grinding process of the encapsulant material, the protection layer 360 is grinded to reveal the conductive vias 350. In some embodiments, portions of the first TIVs 202, portions of the second TIVs 204, and portions of the conductive vias 350 are slightly grinded also. After grinding, each die 300 has an active surface 300a and a rear surface 300b opposite to the active surface 300a. The exposed portion of the conductive vias 350 is located on the active surfaces 300a of the dies 300. On the other hand, the ground plane GP and part of the first conductive patterns 104 are located over the rear surfaces 300b of the dies 300.

Figure 1D:
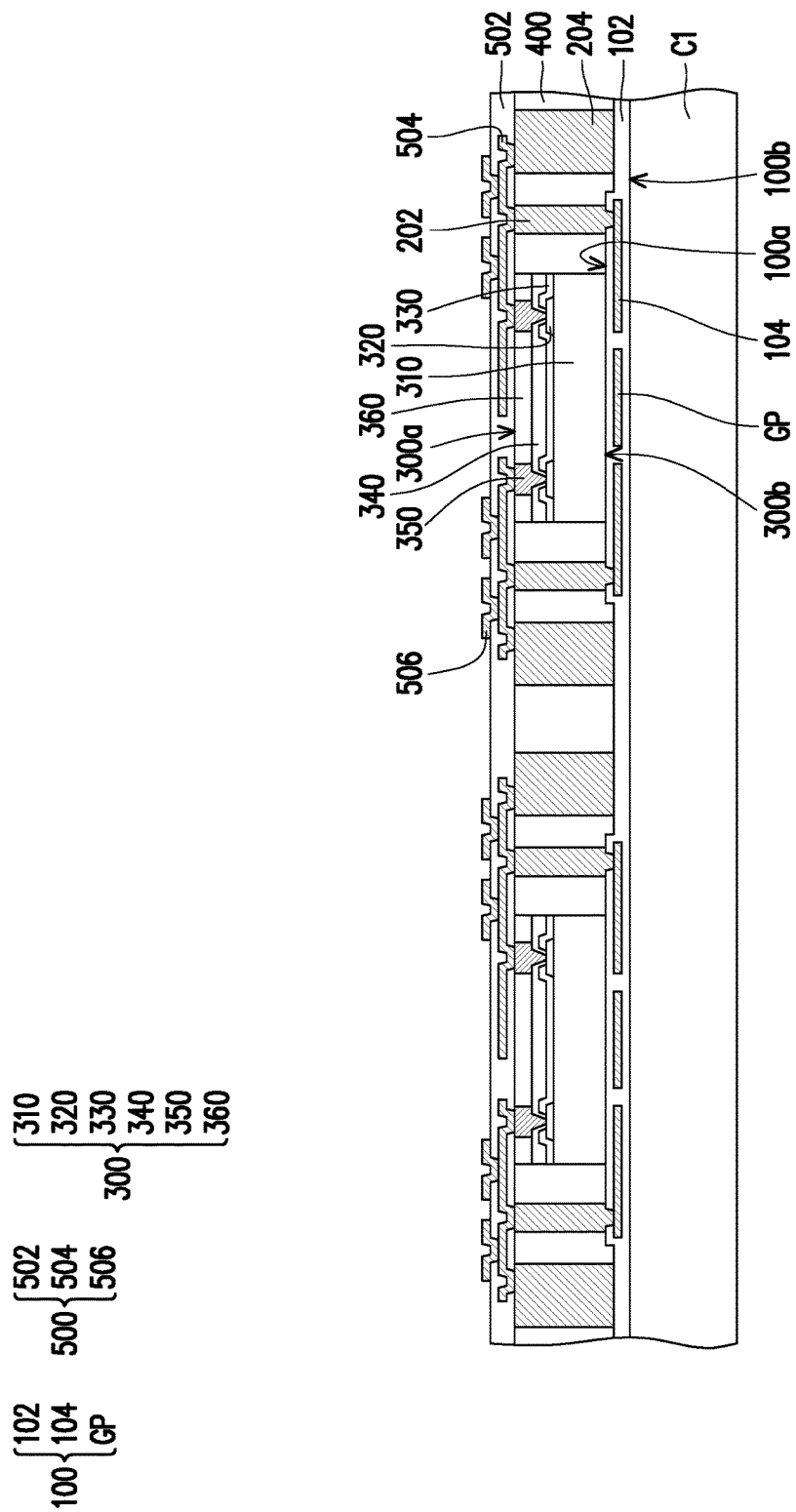

Referring to FIG. 1D, a second redistribution structure 500 is formed on the dies 300, the first TIVs 202, the second TIVs 204, and the encapsulant 400. As illustrated in FIG. 1D, the active surfaces 300a of the dies 300 face the second redistribution structure 500. In other words, the second redistribution structure 500 is disposed on the active surfaces 300a of the dies 300. In some embodiments, the second redistribution structure 500 includes a second dielectric layer 502, a plurality of second conductive patterns 504, and a plurality of under-ball metallurgy (UBM) patterns 506. Similar to the first dielectric layer 102, the second dielectric layer 502 may also include multiple dielectric layers. A material of the second dielectric layer 502 is similar to that of the first dielectric layer 102, so the detailed description thereof is omitted herein. Similarly, the second conductive patterns 504 and the UBM patterns 506 may include the same material as that of the ground plane GP and the first conductive patterns 104, so the detailed descriptions thereof are also omitted herein. The second conductive patterns 504 are electrically connected to the conductive vias 350 of the dies 300, the first TIVs 202, and the second TIVs 204. In other words, the first TIVs 202 electrically connect the first redistribution structure 100 and the second redistribution structure 500. On the other hand, the second TIVs 204 are electrically connected to the second redistribution structure 500. In some embodiments, the second conductive patterns 504 and the UBM patterns 506 may be collectively referred to as a second conductive pattern layer. The UBM patterns 506 are the topmost conductive patterns in the second conductive pattern layer. For example, the UBM patterns 506 may protrude from the second dielectric layer 502 for receiving subsequently formed component. As illustrated in FIG. 1D, the second redistribution structure 500 may be configured such that the dielectric layer (i.e. the dielectric layer(s) in the second dielectric layer 502) and the second conductive pattern layer (i.e. the second conductive patterns 504 and the UBM patterns 506) are stacked in an alternate manner. In some embodiments, the second redistribution structure 500 may be referred to as a front-side redistribution structure.

In some embodiments, the signal output from the die 300 may be transmitted through portions of the second conductive patterns 504, the first TIVs 202, and the first conductive patterns 104 in sequential order. That is, in some embodiments, portions of the second conductive patterns 504, the first TIVs 202, and the first conductive patterns 104 may be collectively referred to as a feed line. It should be noted that the number of the dielectric layers (the second dielectric layer 502) and/or the second conductive pattern layer (i.e. the second conductive patterns 504 and the UBM patterns 506) is not limited by the illustration presented in FIG. 1D. In some alternative embodiments, more dielectric layers and/or more conductive pattern layers may be formed to stack alternately.

Figure 1E:
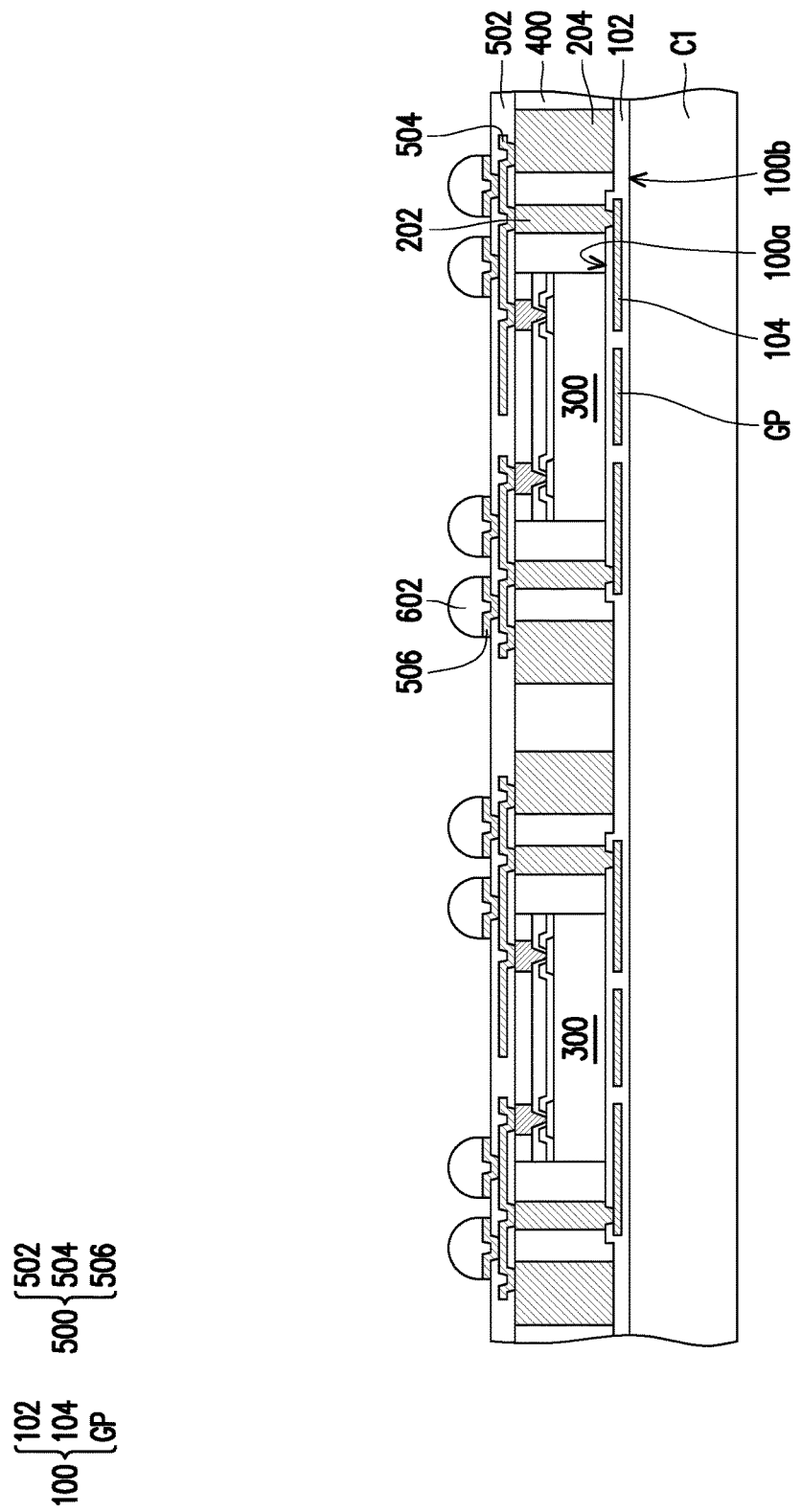

Referring to FIG. 1E, a plurality of conductive terminals 602 are formed on the second redistribution structure 500. In some embodiments, the conductive terminals 602 are attached to the UBM patterns 506 through a solder flux (not shown). In some embodiments, the conductive terminals 600 are, for example, solder balls, ball grid array (BGA) balls, or C4 bumps. In some embodiments, the conductive terminals 602 are made of a conductive material with low resistivity, such as Sn, Pb, Ag, Cu, Ni, Bi, or an alloy thereof. In some embodiments, the conductive terminals 602 may be disposed on the UBM patterns 506 by a ball placement process and/or a reflow process.

Figure 1F:
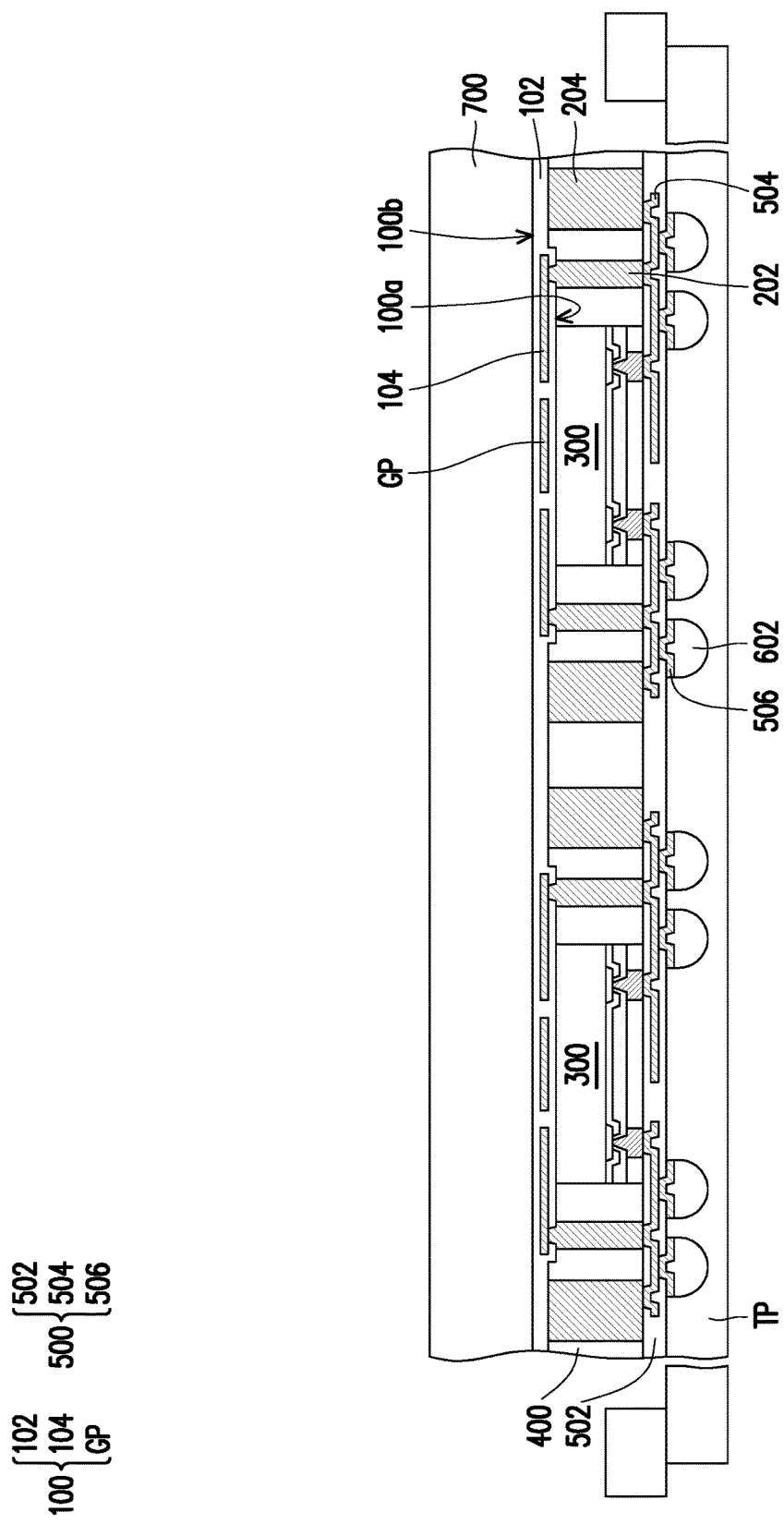

Referring to FIG. 1E and FIG. 1F, the structure illustrated in FIG. 1E is flipped upside down and is attached to a tape TP. In some embodiments, a de-bonding process is performed on the flipped structure. For example, the de-bonding layer (not shown) may be irradiated by UV laser such that the second surface 100b of the first redistribution structure 100 is de-bonded from the carrier C1. Thereafter, an insulating layer 700 is formed over the first redistribution structure 100 opposite to the dies 300. For example, the insulating layer 700 is formed on the second surface 100b of the first redistribution structure 100. In some embodiments, the insulating layer 700 is a polymer layer. For example, the insulating layer 700 includes a photo-sensitive material such as PBO, PI, BCB, a combination thereof, or the like. In some alternative embodiments, the insulating layer 700 includes epoxy resins or any other suitable type of molding materials. In some embodiments, the material of the insulating layer 700 has a low dissipation factor (DO and/or a low permittivity (Dk). Depending on the frequency range of high-speed applications, suitable materials of the insulating layer 700 may be selected based on the required electrical properties of the subsequently formed InFO package 10. The insulating layer 700 is formed by a suitable fabrication technique such as spin-coating, lamination, deposition, or the like. In some embodiments, the insulating layer 700 may be attached to the first redistribution structure 100 through an adhesive layer (not shown).

Figure 1G:
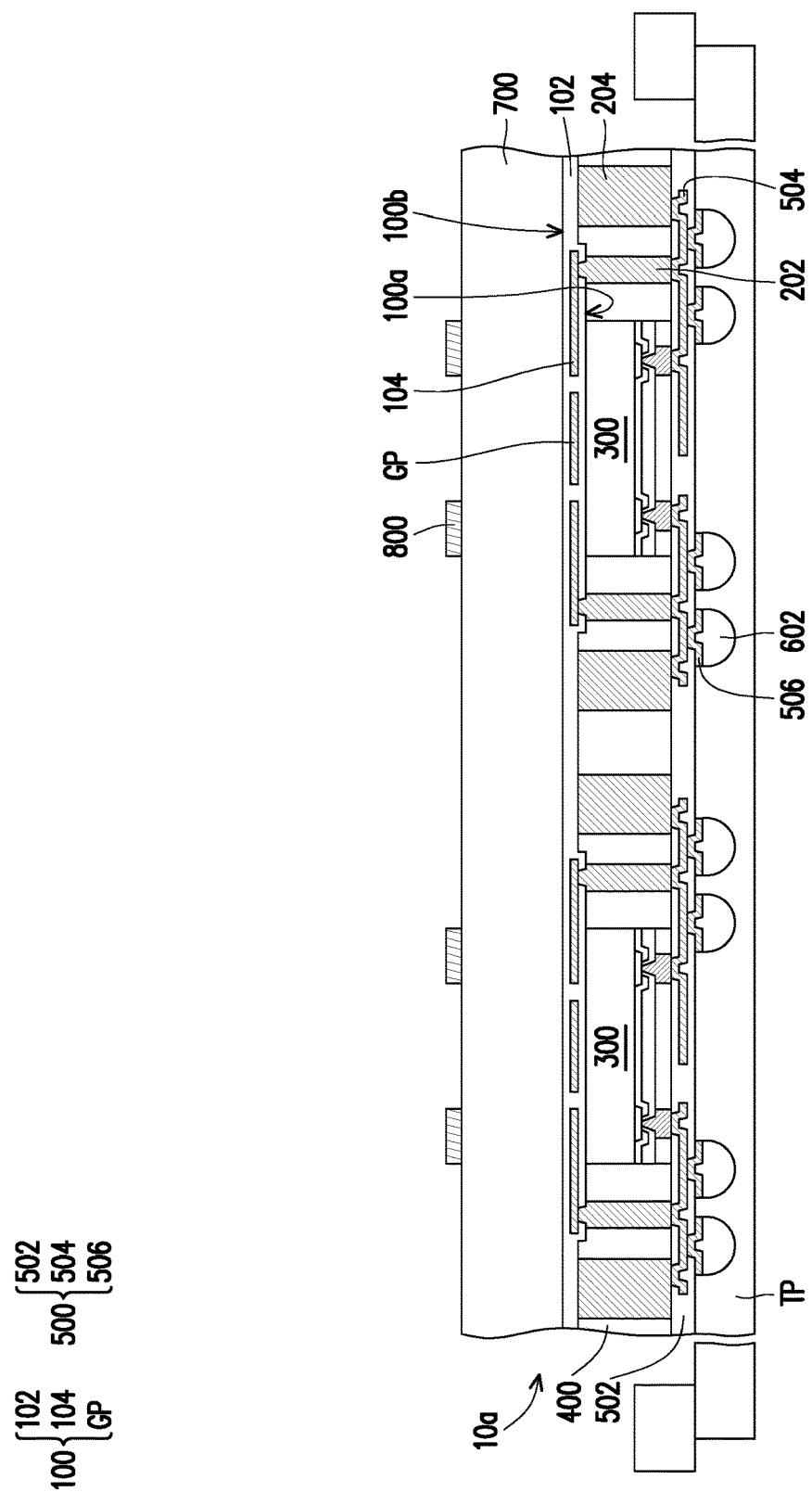

Referring to FIG. 1G, a plurality of conductive patches 800 are formed on the insulating layer 700 to obtain a package array 10a. In some embodiments, the conductive patches 800 may be electrically coupled to the feed line (portions of the second conductive patterns 504, the first TIVs 202, and the first conductive patterns 104). In other words, the signal transmitted in the feed line may be electrically coupled to the conductive patches 800 such that the conductive patches 800 may be referred to as patch antennas. In some embodiments, the conductive patches 800 are formed by forming a metallization layer (not shown) through electroplating or deposition over the insulating layer 700 and then patterning the metallization layer by photolithography and etching processes. In some alternative embodiments, the conductive patches 800 may be formed by forming a plurality of metallization patterns (not shown) directly through plating processes. In some embodiments, the material of the conductive patches 800 includes aluminum, titanium, copper, nickel, tungsten, and/or alloys thereof. In some embodiments, the insulating layer 700 and the conductive patches 800 are optional and the step illustrated in FIG. 1F and FIG. 1G may be omitted.

Figure 1H:
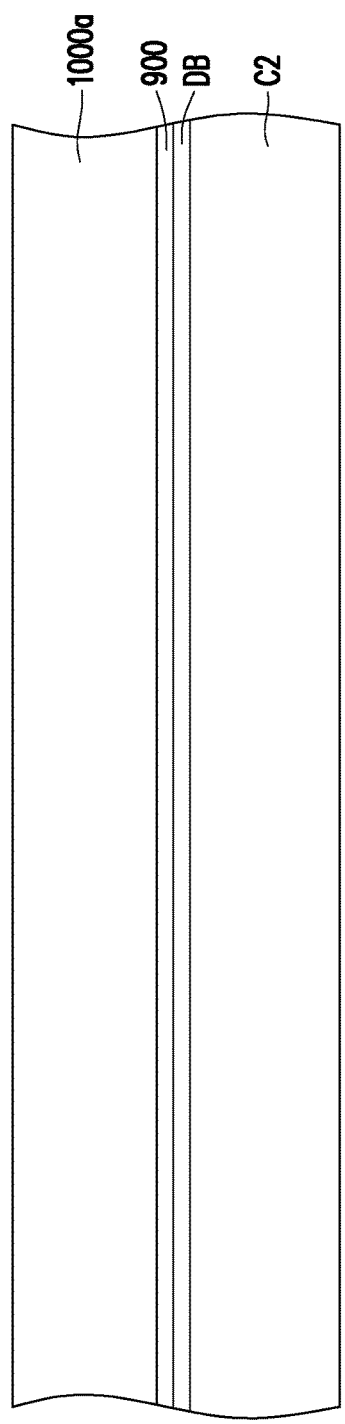
Figure 11:
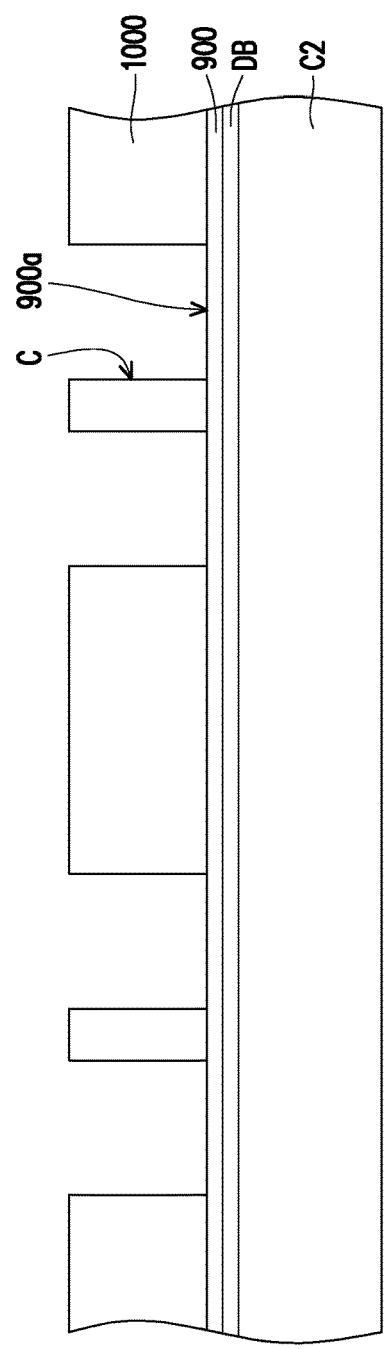

Referring to FIG. 1H and FIG. 1I, when performing the steps illustrated in FIG. 1A to FIG. 1G, the steps illustrated in FIG. 1H and FIG. 1I may be simultaneously conducted. Referring to FIG. 1H, a de-bonding layer DB, a dielectric layer 900, and a core material layer 1000a are sequentially formed on a carrier C2. In some embodiments, the de-bonding layer DB may be a light-to-heat conversion (LTHC) release layer and may aid the removal of the carrier C2 in the subsequent processes. In some embodiments, a material of the dielectric layer 900 may be the same as that of the insulating layer 700. For example, the dielectric layer 900 may include a photo-sensitive material such as PBO, PI, BCB, a combination thereof, or the like. In some alternative embodiments, the dielectric layer 900 may include epoxy resins or any other suitable type of molding materials. In some embodiments, the dielectric layer 900 may be made of pre-impregnated (prepreg) material or core materials. In some embodiments, the material of the dielectric layer 900 has a Df and/or a low Dk. The core material layer 1000a may include materials similar to the material of the dielectric layer 900. For example, the core material layer 1000a may be made of pre-impregnated (prepreg) material, core material, epoxy material, ceramic material, or other suitable materials.

Referring to FIG. 1H and FIG. 1I, a portion of the core material layer 1000a is removed to form a core layer 1000 having a plurality of cavities C. In some embodiments, the portion of the core material layer 1000a is removed to expose part of a surface 900a of the dielectric layer 900. That is, the cavities C expose part of the surface 900a of the dielectric layer 900. In some embodiments, the portion of the core material layer 1000a is removed by a chemical process or a mechanical process. For example, the portion of the core material layer 1000a may be removed through a punching process, a photolithography process, or other suitable patterning methods.

Figure 1J:
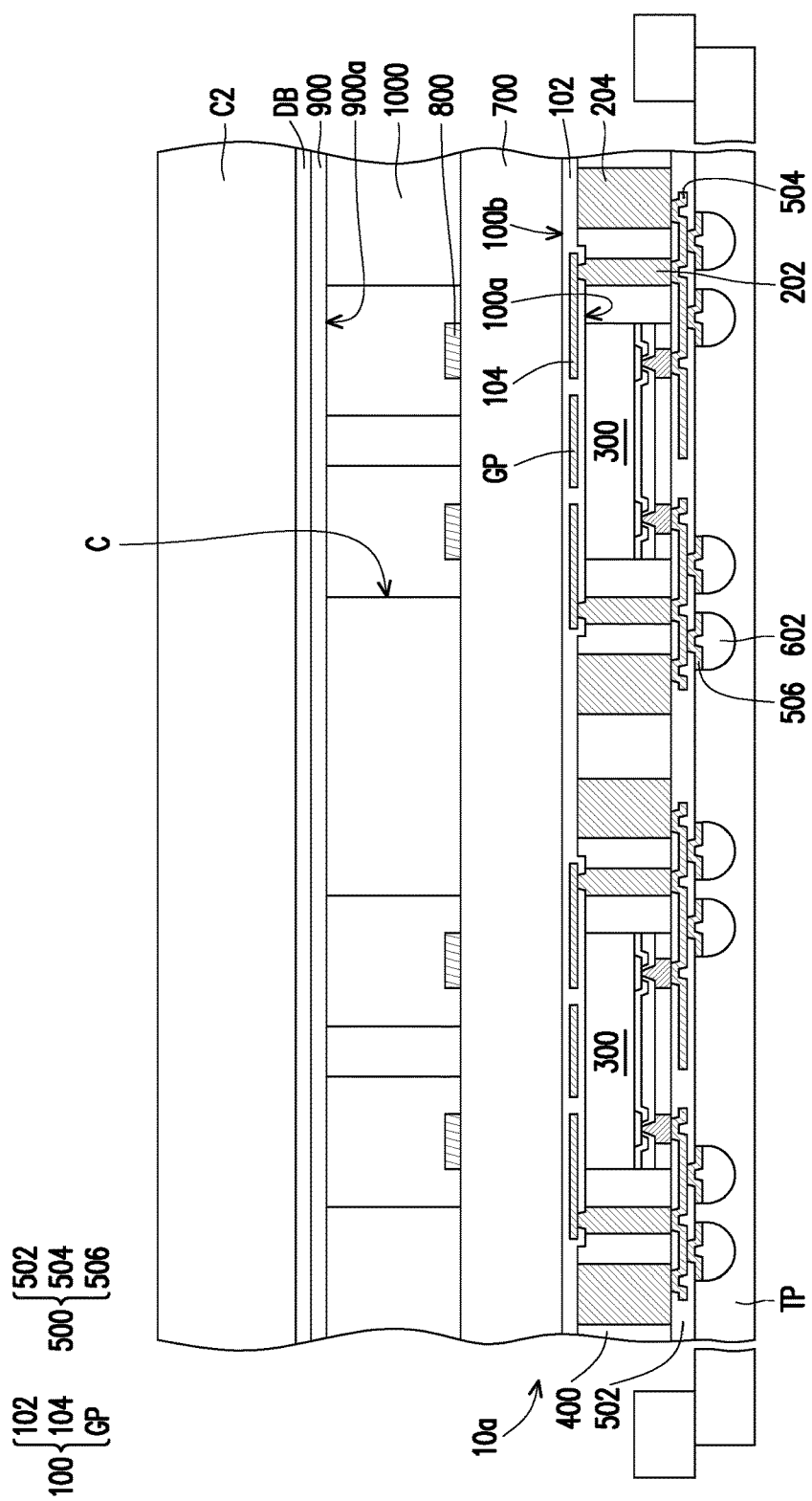

Referring to FIG. 1J, the structure illustrated in FIG. 1I is flipped upside down and is attached onto the package array 10a illustrated in FIG. 1G. For example, the carrier C2, the de-bonding layer DB, the dielectric layer 900, and the core layer 1000 are attached onto the package array 10a such that the core layer 1000 is located between the dielectric layer 900 and the package array 10a. In some embodiments, the surface 900a of the dielectric layer 900 faces the insulating layer 700 while the core layer 1000 is directly in contact with the insulating layer 700. In some embodiments, the structure illustrated in FIG. 1I is placed onto the package array 10a such that the cavities C of the core layer 1000 correspond to the locations of the conductive patches 800 of the package array 10a. For example, each of the conductive patches 800 is located inside of the respective cavity C of the core layer 1000. In some embodiments, alignment marks may be respectively formed in the dielectric layer 900 and the core layer 1000 to ensure the alignment of the conductive patches 800 and the cavities C. In some embodiments, the attachment of the structure illustrated in FIG. 1I onto the package array 10a may be achieved by a lamination process. It should be noted that since the structure illustrated in FIG. 1I takes a wafer form and the attachment is performed on the package array 10a, the attachment process illustrated in FIG. 1J may be considered as a wafer level process or a wafer-to-wafer attachment process. As such, the process complexity may be sufficiently reduced.

Figure 1K:
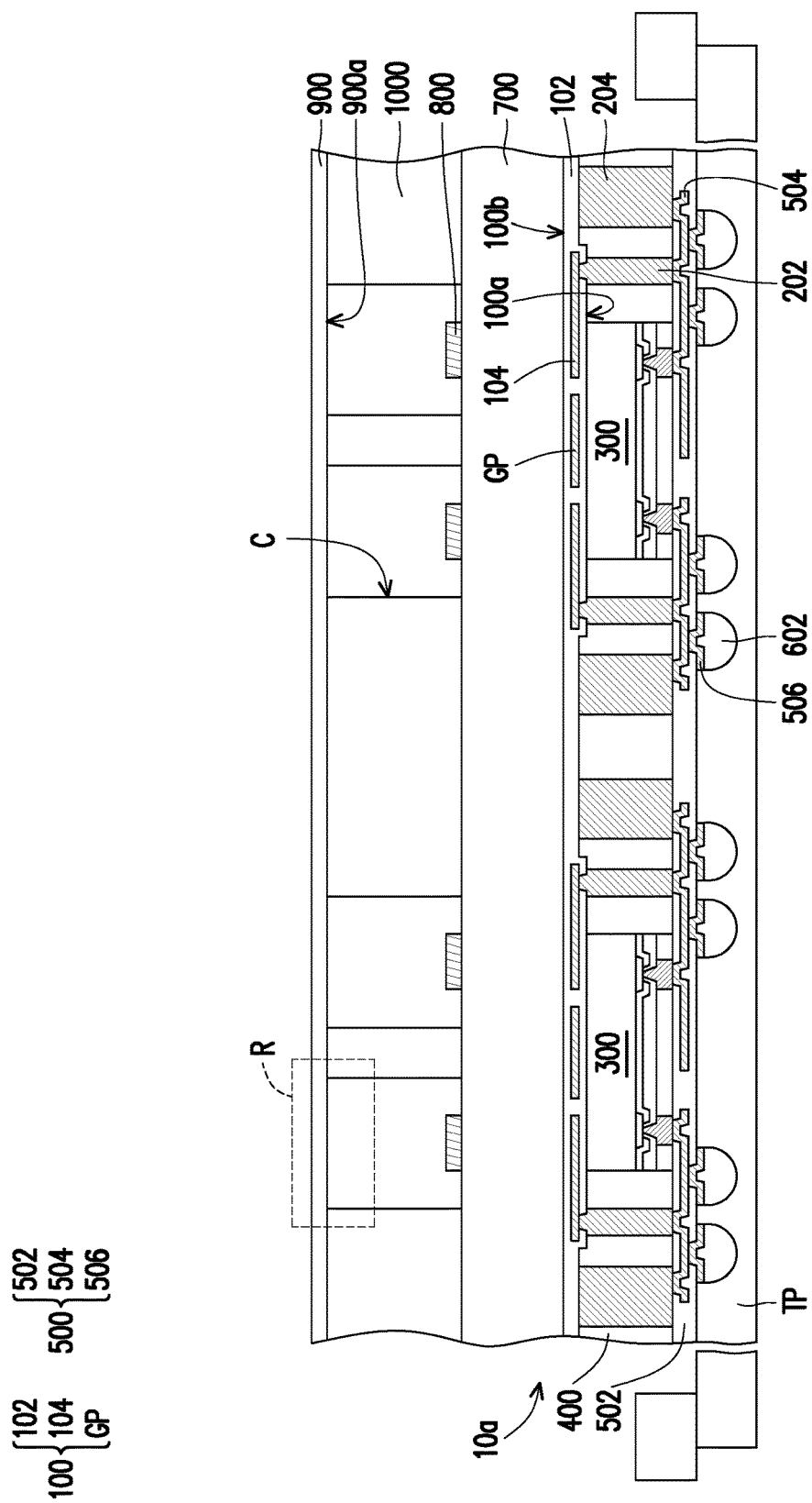

Referring to FIG. 1J and FIG. 1K, the de-bonding layer DB and the carrier C2 are removed from the dielectric layer 900. In some embodiments, the de-bonding layer DB may be irradiated by UV laser such that the de-bonding layer DB and the carrier C2 may be peeled off from the dielectric layer 900.

In some embodiments, a vent may be formed in the core layer 1000 and/or the dielectric layer 900 to enhance the reliability of the subsequently formed InFO package 10. The configuration of the vent will be discussed below in conjunction with FIG. 2A and FIG. 2B.

Figure 2B:
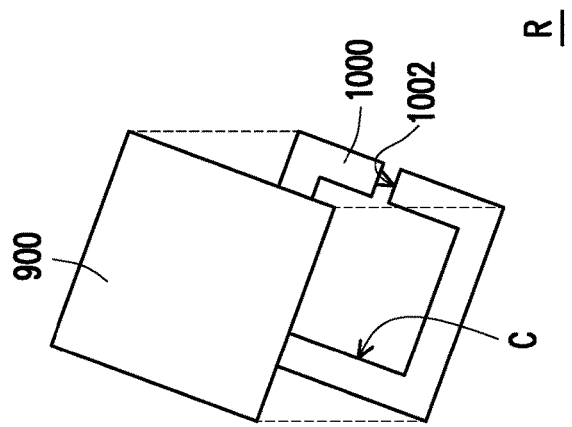
FIG. 2A to FIG. 2B are schematic exploded views of a region in FIG. 1K in accordance with various embodiments of the disclosure.
Figure 2A:
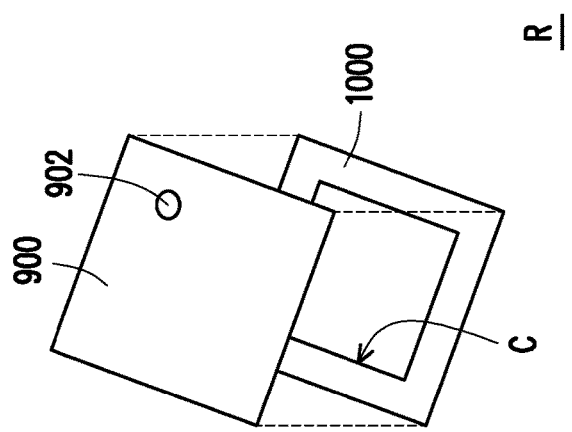

FIG. 2A to FIG. 2B are schematic exploded views of a region R in FIG. 1K in accordance with various embodiments of the disclosure. Referring to FIG. 2A, the dielectric layer 900 may include a vent 902 to communicate the cavities C and the ambient environment. In some embodiments, the vent 902 may be a through hole penetrating through the dielectric layer 902. As illustrated in FIG. 2A, the vent 902 corresponds to the location of the cavity C. For example, a vertical projection (a projection along a direction perpendicular to the surface 900a of the dielectric layer 900) of the vent 902 onto the insulating layer 700 is overlapped with a vertical projection of the cavity C onto the insulating layer 700. That is, the vertical projection of the vent 902 falls within the space constituting the cavity C. In some embodiments, the vent 902 may be formed through a punching process, a photolithography process, or other suitable processes. As illustrated in FIG. 2A, the core layer 1000 is free of the vent. However, the disclosure is not limited thereto. Referring to FIG. 2B, the core layer 1000 has a vent 1002 while the dielectric layer 900 is free of the vent. In some embodiments, the vent 1002 may be a notch within the core layer 1000 to communicate the cavities C and the ambient environment. Similar to that of the vent 902, the vent 1002 in the core layer 1000 may be formed through a punching process, a photolithography process, or other suitable processes. Although FIG. 2A and FIG. 2B illustrated that only one of the dielectric layer 900 and the core layer 1000 has the vent, the disclosure is not limited thereto. In some alternative embodiments, the vent 902 and the vent 1002 may be respectively formed in the dielectric layer 900 and the core layer 1000 at the same time. In some embodiments, the cavities C are air cavities and the vent 902, 1002 are air vents. In some embodiments, the vent 902 and/or the vent 1002 are able to balance the pressure inside and outside of the cavities C, thereby avoiding deformation of the dielectric layer 900. As such, the reliability of the subsequently formed InFO package 10 may be sufficiently enhanced.

Referring to FIG. 1L and FIG. 1M, when performing the steps illustrated in FIG. 1A to FIG. 1K, the steps illustrated in FIG. 1L and FIG. 1M may be simultaneously conducted. Referring to FIG. 1L, an adhesive layer AD' and a conductive foil 1100a are sequentially formed on a carrier C3. In some embodiments, a de-bonding layer (not shown) may be formed between the adhesive layer AD' and the carrier C3 for removing the carrier C3 in the subsequent processes. In some embodiments, the adhesive layer AD' may include materials having a low Df and/or a low Dk. On the other hand, the conductive foil 1100a may include aluminum foil, titanium foil, copper foil, nickel foil, tungsten foil, and/or foils made by alloys thereof. In some embodiments, a thickness $t_{AD}'$ of the adhesive layer AD' may range between 15 μm and 50 μm. On the other hand, a thickness $t_{1100a}$ of the conductive foil 1100a may range between 35 μm and 100 μm.

Referring to FIG. 1L and FIG. 1M, portions of the adhesive layer AD' and portions of the conductive foil 1100a are removed to form a plurality of conductive patches 1100 and an adhesive layer AD located between the conductive patches 1100 and the carrier C3. In some embodiments, portions of the adhesive layer AD' and portions of the conductive foil 1100a may be removed through a punching process. In some embodiments, with the adaption of the punching process, the size of the conductive patches 1100 may be precisely controlled. That is, conductive patches 1100 with desired size may be easily obtained through the steps illustrated in FIG. 1L and FIG. 1M.

Figure 1N:
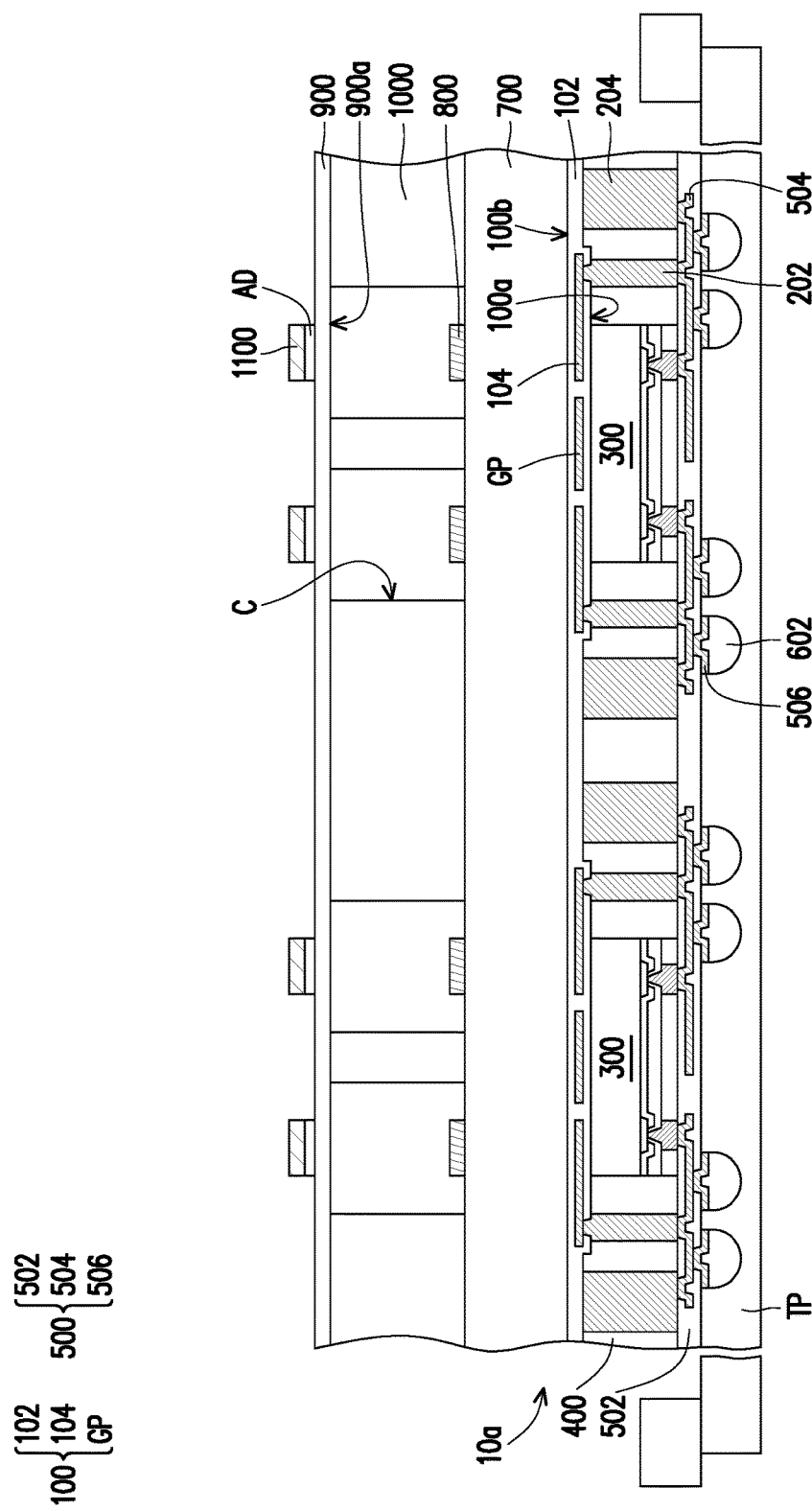
Figure 10:
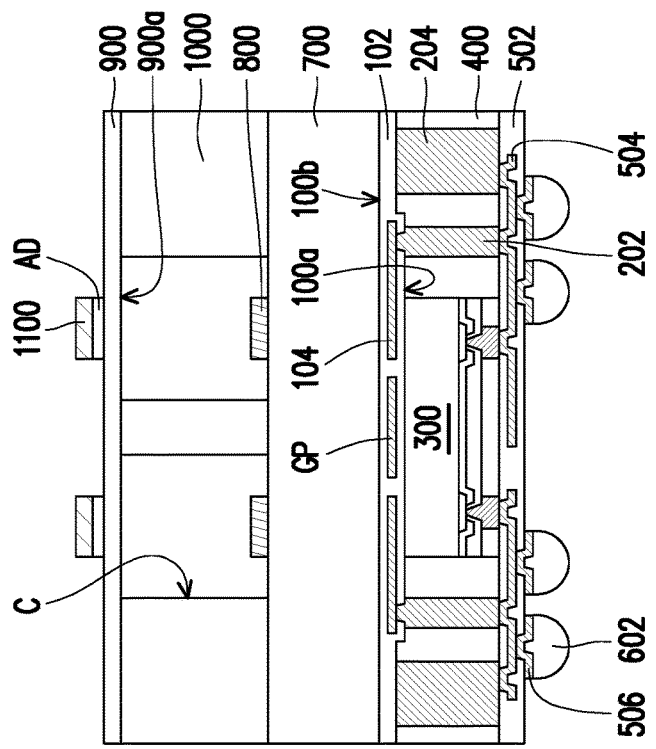

Referring to FIG. 1N, the conductive patches 1100 shown in FIG. 1M are removed from the carrier C3 and are placed onto the structure illustrated in FIG. 1K. For example, the conductive patches 1100 having the adhesive layer AD attached thereon is placed onto the dielectric layer 900. The conductive patches 1100 may be placed one by one through a pick-and-place process. In some embodiments, the conductive patches 1100 are laminated on the dielectric layer 900 through the adhesive layer AD. As illustrated in FIG. 1N, the conductive patches 1100 are placed above the cavities C. In some embodiments, the conductive patches 1100 are placed corresponding to the cavities C. For example, a vertical projection (a projection along a direction perpendicular to the surface 900a of the dielectric layer 900) of the conductive patches 1100 onto the insulating layer 700 is overlapped with a vertical projection of the cavities C onto the insulating layer 700. As mentioned above, the signal transmitted in the feed line may be electrically coupled to the conductive patches 800. In some embodiments, the signal may be further coupled to the conductive patches 1100 via the conductive patches 800. Therefore, the properties of the medium between the conductive patches 800 and the conductive patches 1100 are crucial. In general, mediums having low Dk and Df are able to provide low loss transmission path. Since air has low Dk and Df values, the cavities C (filled with air) located between the conductive patches 800 and the conductive patches 1100 are able to provide a low loss signal transmission path, thereby allowing higher gain of the patch antenna. As a result, the antenna efficiency of the subsequently formed InFO package 10 may be sufficiently enhanced.

In some embodiments, if the dielectric layer 900 is cured before the conductive patches 1100 are placed thereon, the adaption of the adhesive layer AD is able to sufficiently enhance the adhesion between the conductive patches 1100 and the dielectric layer 900. However, the disclosure is not limited thereto. In some alternative embodiments, the dielectric layer 900 may be cured after the conductive patches 1100 are placed thereon. Under this scenario, the formation of the adhesive layer AD between the conductive patches 1100 and the dielectric layer 900 may be optional.

In some alternative embodiments, the conductive patches 1100 may be attached to the dielectric layer 900 through other methods. That is, the steps illustrated in FIG. 1L to FIG. 1N may be replaced by other steps. The detailed descriptions of other methods for attaching the conductive patches 1100 onto the dielectric layer 900 will be discussed below in conjunction with FIG. 3A to FIG. 3D and FIG. 4A to FIG. 4F.

Figure 3C:
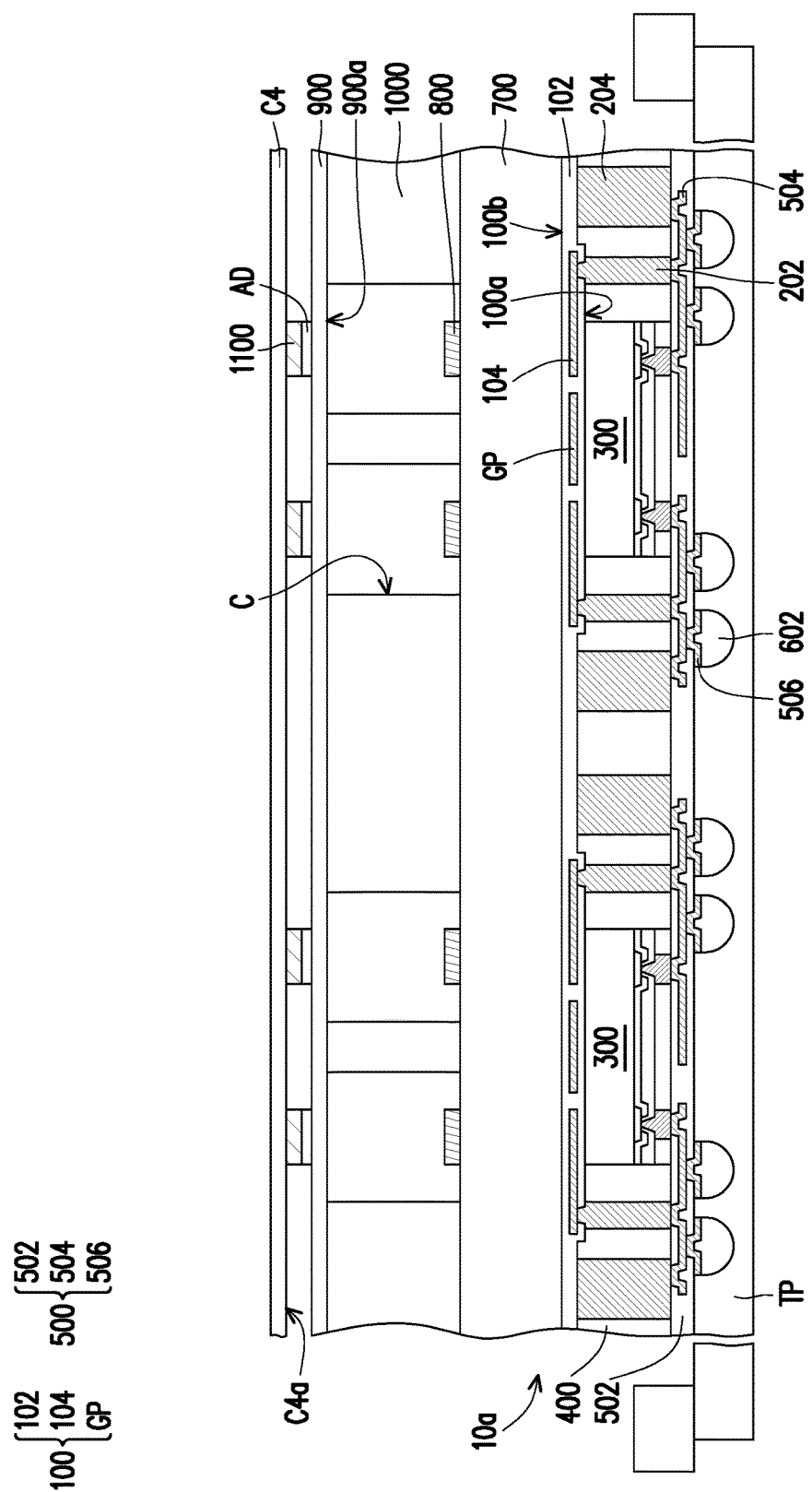

FIG. 3A to FIG. 3D are schematic cross-sectional views illustrating various stages of a manufacturing process of the InFO package 10 in accordance with some alternative embodiments of the disclosure. In some embodiments, the steps illustrated in FIG. 1L to FIG. 1N may be replaced by the steps illustrated in FIG. 3A to FIG. 3D. Referring to FIG. 3A, a conductive foil 1100a and an adhesive layer AD' are sequentially placed on a carrier film C4. In some embodiments, a de-bonding layer (not shown) may be formed between the conductive foil 1100a and the carrier film C4 for removing the carrier film C4 in the subsequent processes. In some embodiments, the adhesive layer AD' may include materials having a low Df and/or a low Dk. On the other hand, the conductive foil 1100a may include aluminum foil, titanium foil, copper foil, nickel foil, tungsten foil, and/or foils made by alloys thereof.

Referring to FIG. 3A and FIG. 3B, portions of the conductive foil 1100a and portions of the adhesive layer AD' are removed to form a plurality of conductive patches 1100 and an adhesive layer AD. In some embodiments, upon removal of portions of the conductive foil 1100a and portions of the adhesive layer AD', part of a surface C4a of the carrier film C4 is exposed. As illustrated in FIG. 3B, the conductive patches 1100 are located between the carrier film C4 and the adhesive layer AD. In some embodiments, portions of the conductive foil 1100a' and portions of the conductive foil 1100a may be removed through a punching process. In some embodiments, with the adaption of the punching process, the size of the conductive patches 1100 may be precisely controlled. That is, conductive patches 1100 with desired size may be easily obtained through the steps illustrated in FIG. 3A and FIG. 3B.

Referring to FIG. 3C, the structure illustrated in FIG. 3B is flipped upside down and is attached onto the structure illustrated in FIG. 1K. For example, the carrier film C4, the conductive patches 1100, and the adhesive layer AD are attached onto the dielectric layer 900 such that the adhesive layer AD and the conductive patches 1100 are located between the dielectric layer 900 and the carrier film C4. In some embodiments, the surface C4a of the carrier film C4 faces the dielectric layer 900 while the adhesive layer AD is directly in contact with the dielectric layer 900. In some embodiments, the attachment of the structure illustrated in FIG. 3B onto the structure illustrated in FIG. 1K may be achieved by a lamination process. Similar to the step illustrated in FIG. 1N, the conductive patches 1100 are placed corresponding to the cavities C. It should be noted that since the structure illustrated in FIG. 3B takes a wafer form, the attachment process illustrated in FIG. 3C may be considered as a wafer level process or a wafer-to-wafer attachment process. As such, the process complexity may be sufficiently reduced.

Figure 3D:
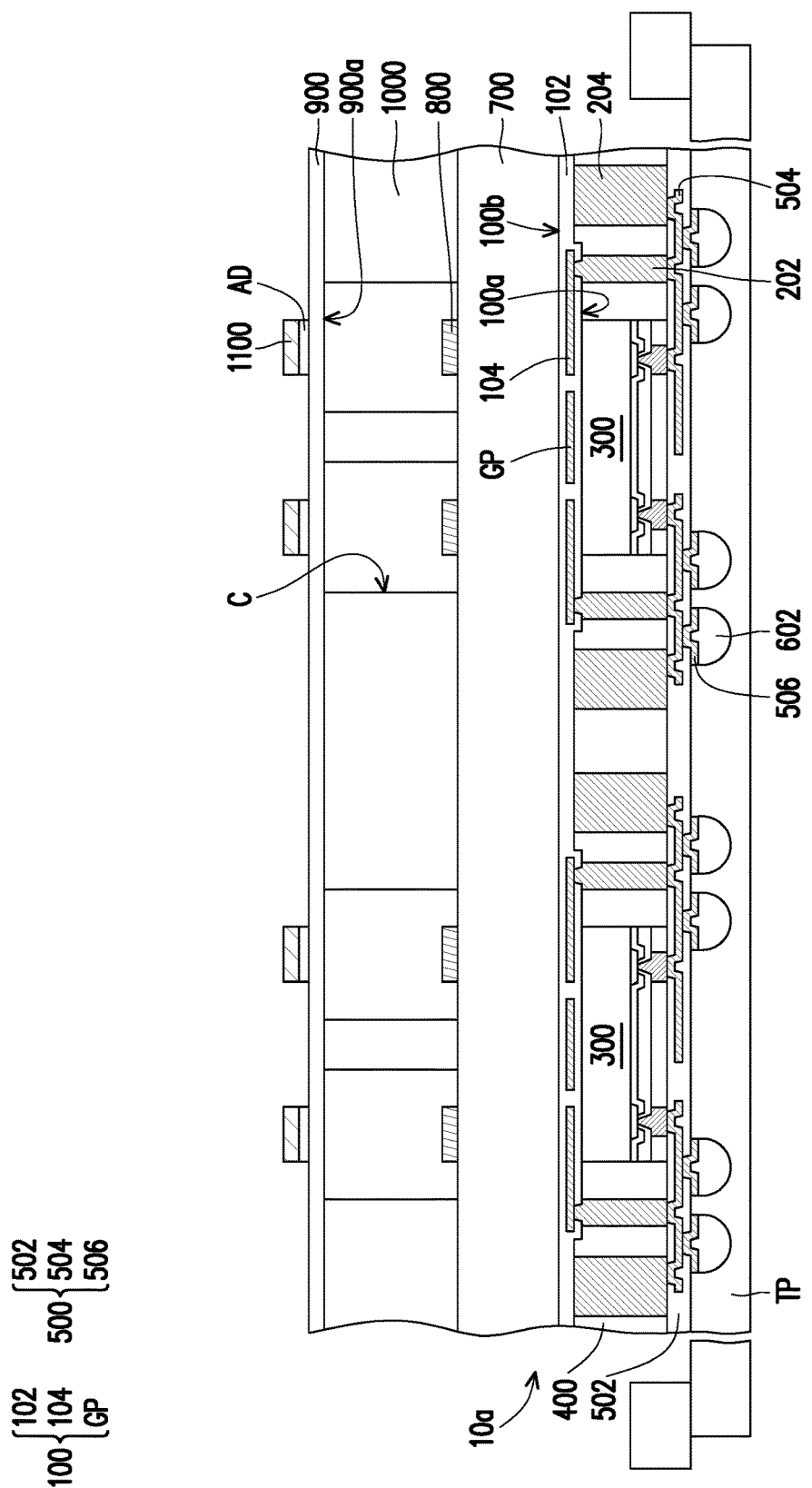

Referring to FIG. 3D, the carrier film C4 is removed from the conductive patches 1100. In some embodiments, the de-bonding layer (not shown) may be irradiated by UV laser such that the de-bonding layer and the carrier film C4 may be peeled off from the conductive patches 1100.

In some embodiments, if the dielectric layer 900 is cured before the conductive patches 1100 are placed thereon, the adaption of the adhesive layer AD is able to sufficiently enhance the adhesion between the conductive patches 1100 and the dielectric layer 900. However, the disclosure is not limited thereto. In some alternative embodiments, the dielectric layer 900 may be cured after the conductive patches 1100 are placed thereon. Under this scenario, the formation of the adhesive layer AD between the conductive patches 1100 and the dielectric layer 900 may be optional.

Figure 4C:
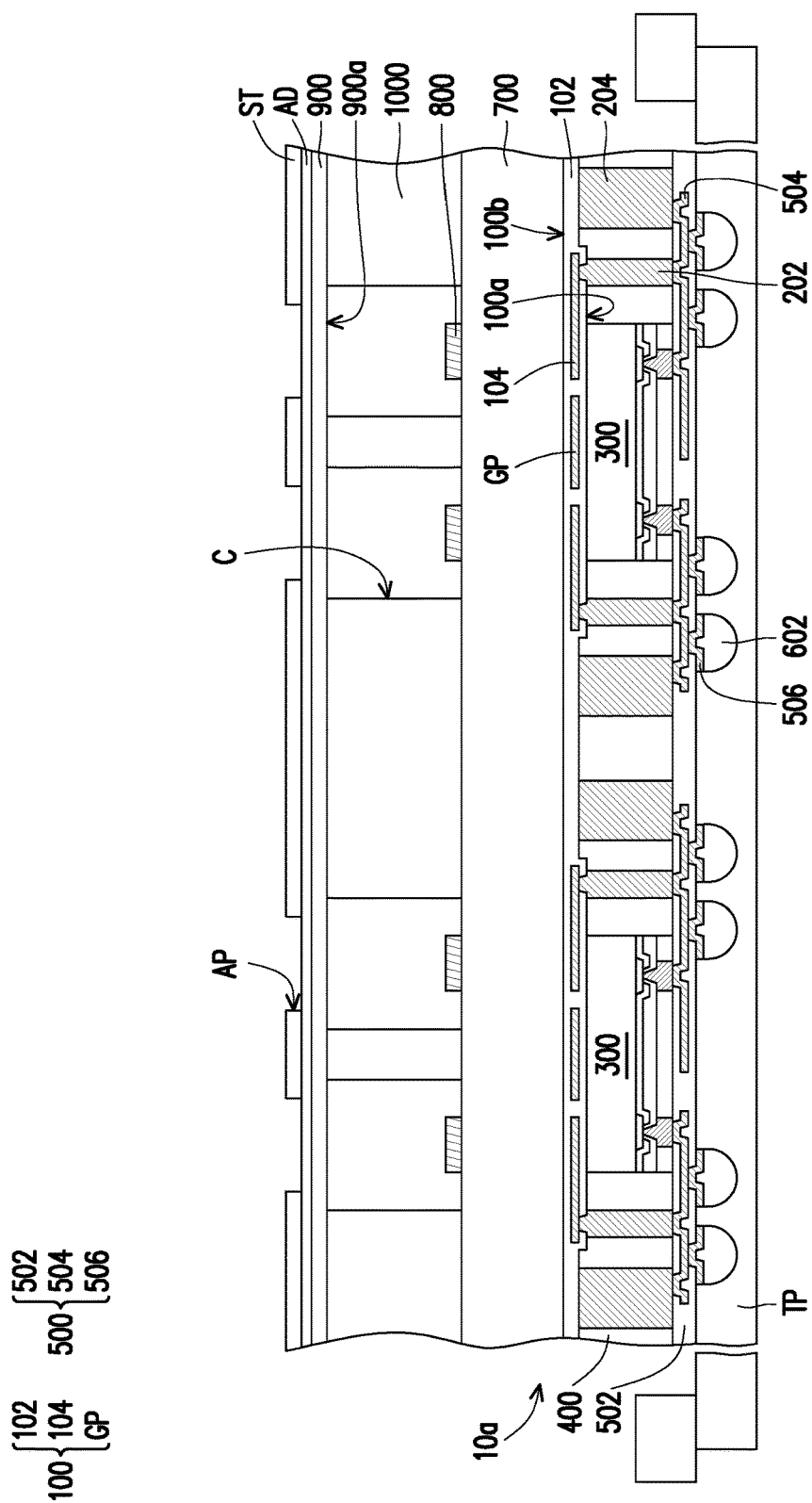

FIG. 4A to FIG. 4F are schematic cross-sectional views illustrating various stages of a manufacturing process of the InFO package 10 in accordance with some alternative embodiments of the disclosure. In some embodiments, the steps illustrated in FIG. 1L to FIG. 1N may be replaced by the steps illustrated in FIG. 4A to FIG. 4F. Referring to FIG. 4A, a conductive foil is formed on a carrier C5. In some embodiments, a de-bonding layer (not shown) may be formed between the conductive foil 1100a and the carrier C5 for removing the carrier C5 in the subsequent processes. In some embodiments, the conductive foil 1100a may include aluminum foil, titanium foil, copper foil, nickel foil, tungsten foil, and/or foils made by alloys thereof.

Referring to FIG. 4B, portions of the conductive foil 1100a are removed to form a plurality of conductive patches 1100 over the carrier C5. In some embodiments, portions of the conductive foil 1100a may be removed through a punching process. In some embodiments, with the adaption of the punching process, the size of the conductive patches 1100 may be precisely controlled. That is, conductive patches 1100 with desired size may be easily obtained through the steps illustrated in FIG. 4A and FIG. 4B.

Referring to FIG. 4C, an adhesive layer AD is formed over the structure illustrated in FIG. 1K. For example, the adhesive layer AD is formed over the dielectric layer 900. In some embodiments, the adhesive layer AD may include materials having a low Df and/or a low Dk. After the adhesive layer AD is formed on the dielectric layer 900, a stencil ST is provided over the dielectric layer 900 and the adhesive layer AD. The stencil ST has a plurality of apertures AP exposing portions of the adhesive layer AD. In some embodiments, the locations of the apertures AP of the stencil ST correspond to the locations of the cavities C of the core layer 1000. For example, a vertical projection (a projection along a direction perpendicular to the surface 900a of the dielectric layer 900) of the apertures AP onto the insulating layer 700 is overlapped with a vertical projection of the cavities C onto the insulating layer 700.

Figure 4D:
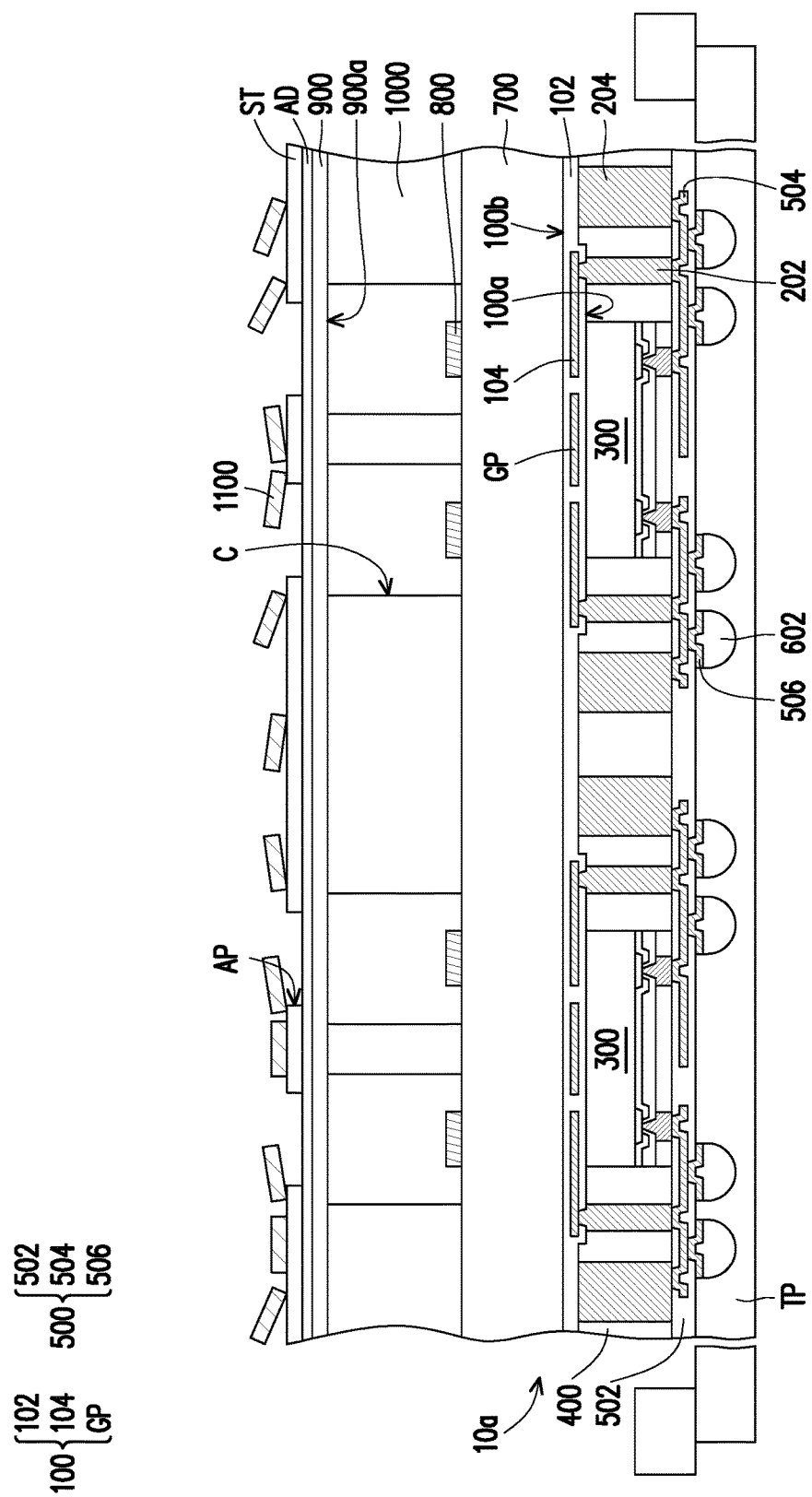

Referring to FIG. 4D, the conductive patches 1100 shown in FIG. 4B are removed from the carrier C5 and are distributed over the stencil ST. As illustrated in FIG. 4D, the conductive patches 1100 are randomly distributed over the stencil ST.

Figure 4E:
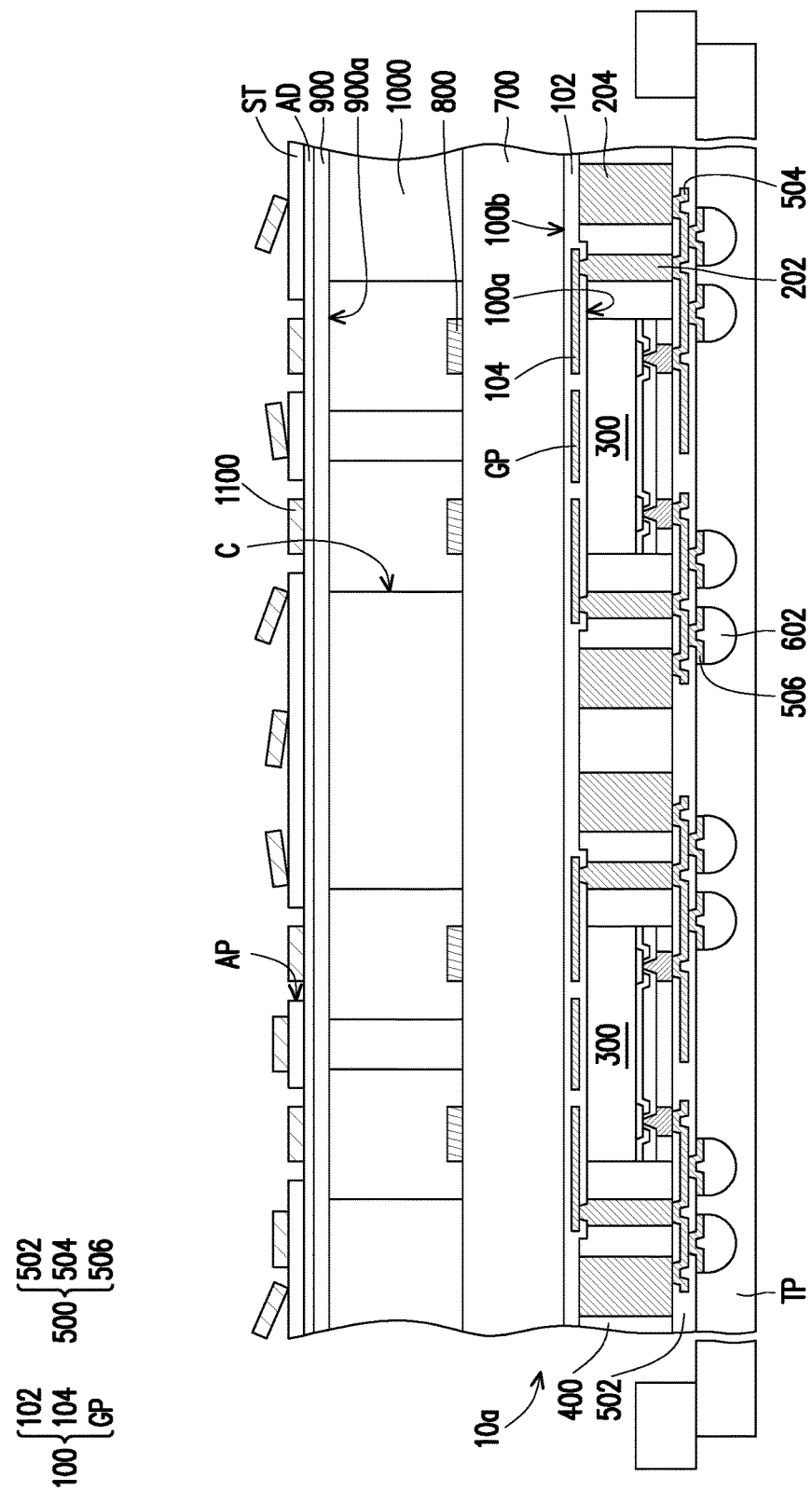

Referring to FIG. 4E, the structure illustrated in FIG. 4D may be shook such that the conductive patches 1100 falls into the corresponding aperture AP. For example, the conductive patches 1100 may be subjected to a specific vibration such that the conductive patches 1100 are driven into the apertures AP of the stencil ST, thereby attaching to the dielectric layer 900 through the adhesive layer AD. In some alternative embodiments, the structure illustrated in FIG. 4D may be tilted, so the conductive patches 1100 are driven into the apertures AP of the stencil ST through gravitational force.

Figure 4F:
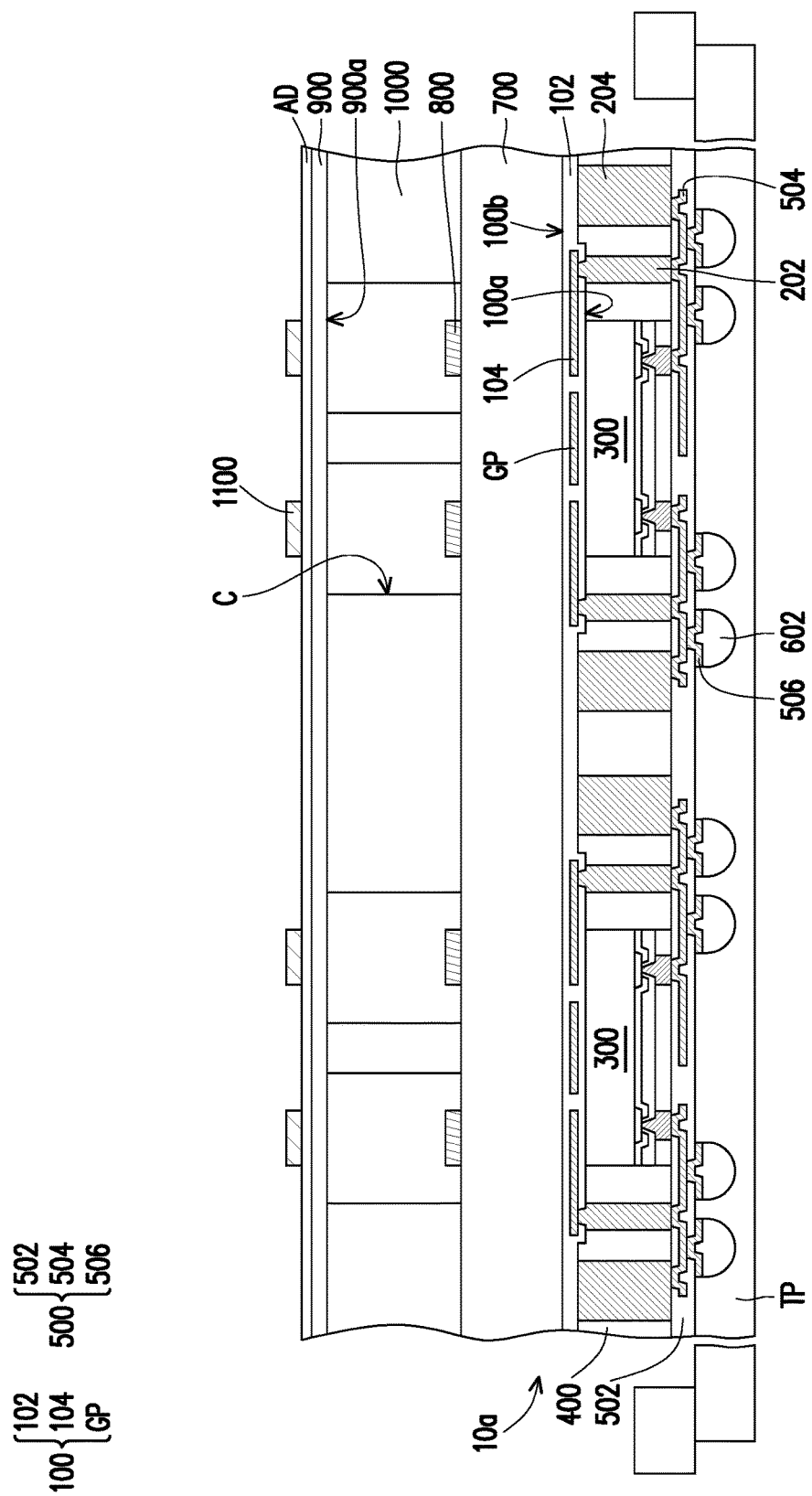

Referring to FIG. 4F, upon ensuring each of the apertures AP is filled by a conductive patch 1100, the stencil ST and the excess conductive patches 1100 are removed. Since the locations of the apertures AP correspond to the locations of the cavities C, similar to the step illustrated in FIG. 1N, the remaining conductive patches 1100 are placed corresponding to the cavities C. In some embodiments, the steps illustrated in FIG. 4C to FIG. 4F may be referred to as a patch placement process.

In some embodiments, if the dielectric layer 900 is cured before the conductive patches 1100 are placed thereon, the adaption of the adhesive layer AD is able to sufficiently enhance the adhesion between the conductive patches 1100 and the dielectric layer 900. However, the disclosure is not limited thereto. In some alternative embodiments, the dielectric layer 900 may be cured after the conductive patches 1100 are placed thereon. Under this scenario, the formation of the adhesive layer AD between the conductive patches 1100 and the dielectric layer 900 may be optional. That is, in the step illustrated in FIG. 4C to FIG. 4E, the apertures AP of the stencil ST exposes the dielectric layer 900 and the conductive patches 1100 are driven into the apertures AP to be directly in contact with the dielectric layer 900.

It should be noted that the steps illustrated in FIG. 1L to FIG. 1N, FIG. 3A to FIG. 3D, and FIG. 4A to FIG. 4E are not limited to the formation of the conductive patches 1100. In some embodiments, the conductive patches 800 may be formed by similar methods as described in these figures.

Referring back to FIG. 1O, the tape TP is removed and the structure illustrated in FIG. 1N may undergo a singulation process to form the InFO package 10. For example, a singulation process may be performed on the package array 10a, the dielectric layer 900, and the core layer 1000 to obtain the InFO package 10. As illustrated in FIG. 1O, the InFO package 10 has dual patch layer (the conductive patches 800 and the conductive patches 1100) configuration. By adapting two patch layers, applications requiring larger bandwidth may be realized.

Figure 5A:
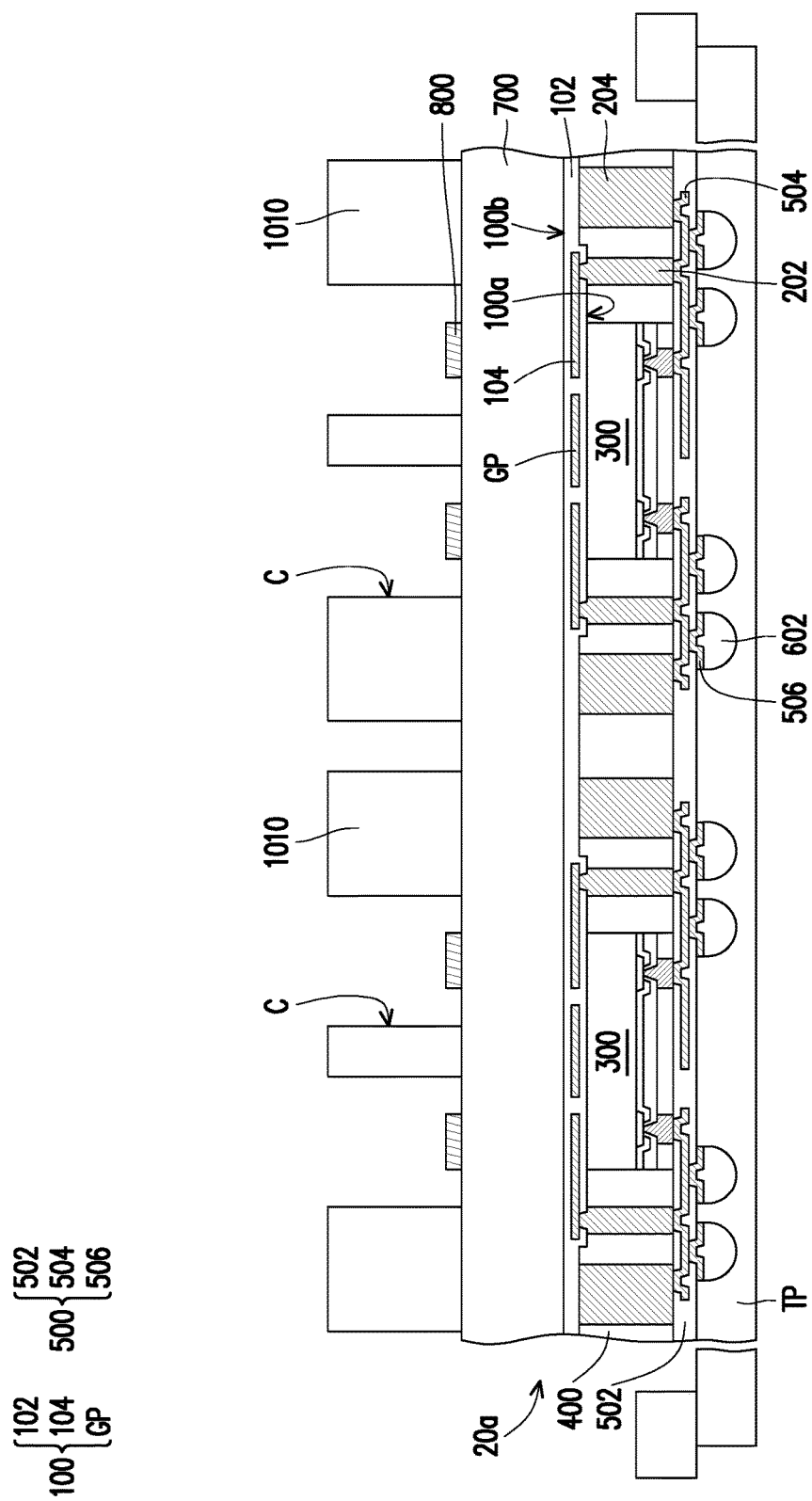
FIG. 5A to FIG. 5D are schematic cross-sectional views illustrating various stages of a manufacturing process of an InFO package in accordance with some alternative embodiments of the disclosure.

FIG. 5A to FIG. 5D are schematic cross-sectional views illustrating various stages of a manufacturing process of an InFO package 20 in accordance with some alternative embodiments of the disclosure. Referring to FIG. 5A, a plurality of core patterns 1010 are placed on a package array 20a. The formation method and the configuration of the package array 20a are similar to the package array 10a in FIG. 1A to FIG. 1G, so the detailed description thereof is omitted herein. The detailed description of the core patterns 1010 will be presented below in conjunction with FIG. 6. FIG. 6 is a schematic top view of the core pattern 1010 in FIG. 5A. Referring to FIG. 5A and FIG. 6, each of the core patterns 1010 has a plurality of cavities C. In some embodiments, the core patterns 1010 are pre-fabricated. The core patterns 1010 may be formed by the following steps. First, a core material layer (not shown) made of pre-impregnated (prepreg) material, core material, epoxy material, ceramic material, or other suitable materials is provided. Thereafter, a portion of the core material layer is removed to form a plurality of cavities penetrating through the core material layer. The portion of the core material layer may be removed by a chemical process or a mechanical process. For example, the portion of the core material layer may be removed through a punching process, a photolithography process, or other suitable patterning methods. Subsequently, the core material layer having the cavities is diced or cut into several units of core pattern 1010.

In some embodiments, the core patterns 1010 are placed on the insulating layer 700 one by one through a pick-and-place process. The core patterns 1010 are placed such that the cavities C of the core patterns 1010 correspond to the conductive patches of the package array 20a. For example, each of the conductive patches 800 is located inside of the respective cavity C of the core pattern 1010. As illustrated in FIG. 5A, the core patterns 1010 are spaced apart from each other. In some embodiments, the attachment of the core patterns 1010 onto the package array 20a may be achieved by a lamination process.

Figure 5B:
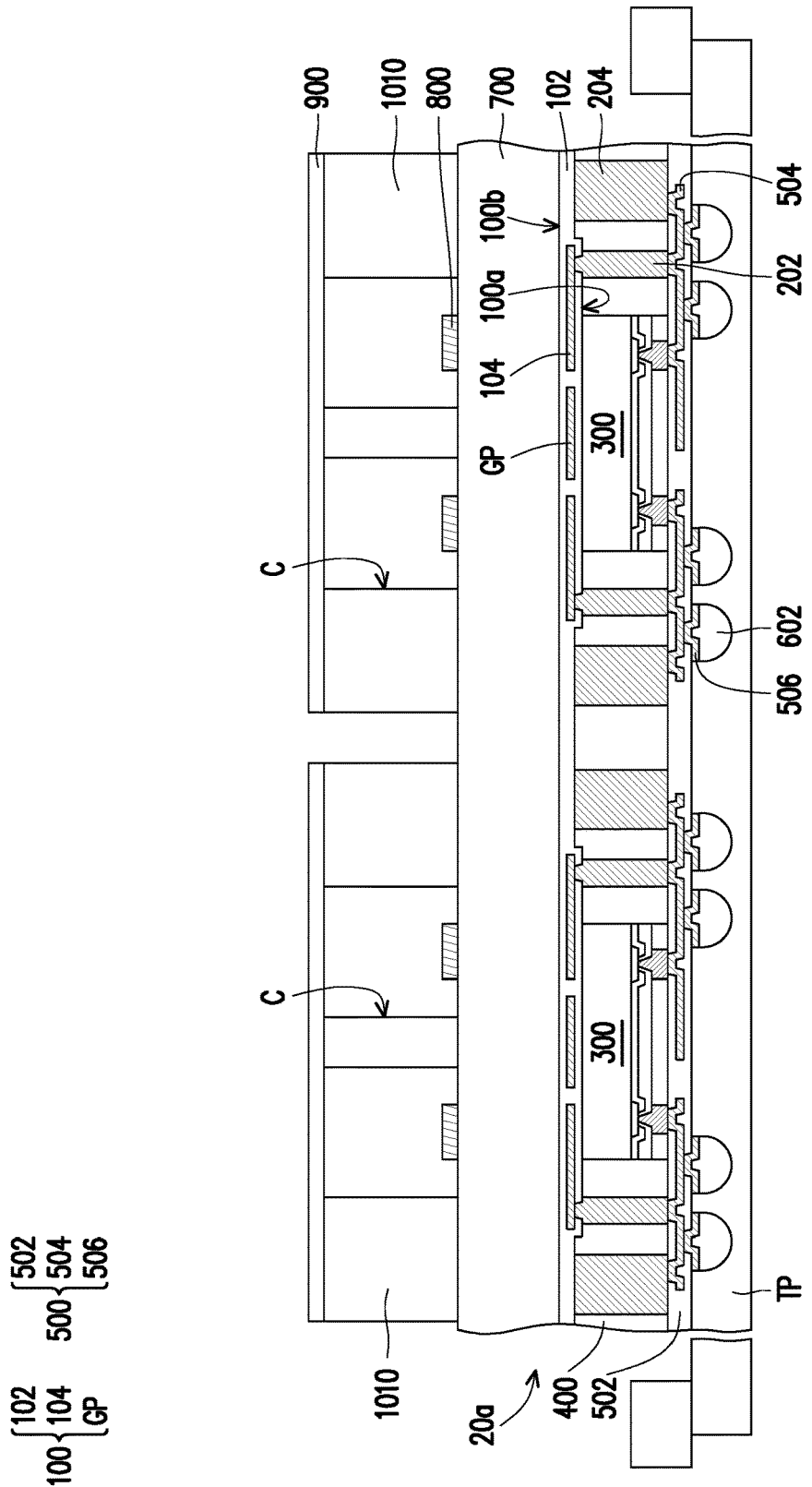
Figure 6:
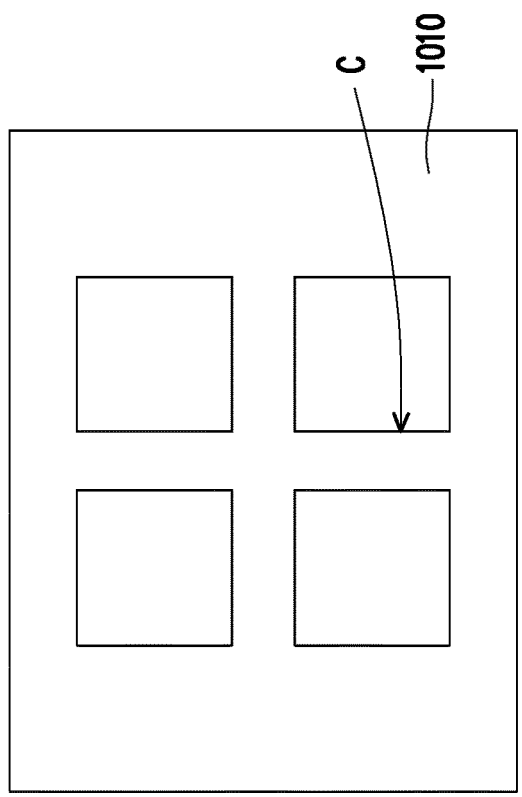
FIG. 6 is a schematic top view of a core pattern in FIG. 5A.

Referring to FIG. 5B, a dielectric layer 900 is formed on the core patterns 1010. In some embodiments, the dielectric layer 900 may serve as a cap layer covering the cavities C of the core patterns 1010. The dielectric layer 900 may include a photo-sensitive material such as PBO, PI, BCB, a combination thereof, or the like. In some alternative embodiments, the dielectric layer 900 may include epoxy resins or any other suitable type of molding materials. In some embodiments, the dielectric layer 900 may be made of impregnated (prepreg) material or core material. In some embodiments, the material of the dielectric layer 900 has a low Df and/or a Dk.

Figure 5C:
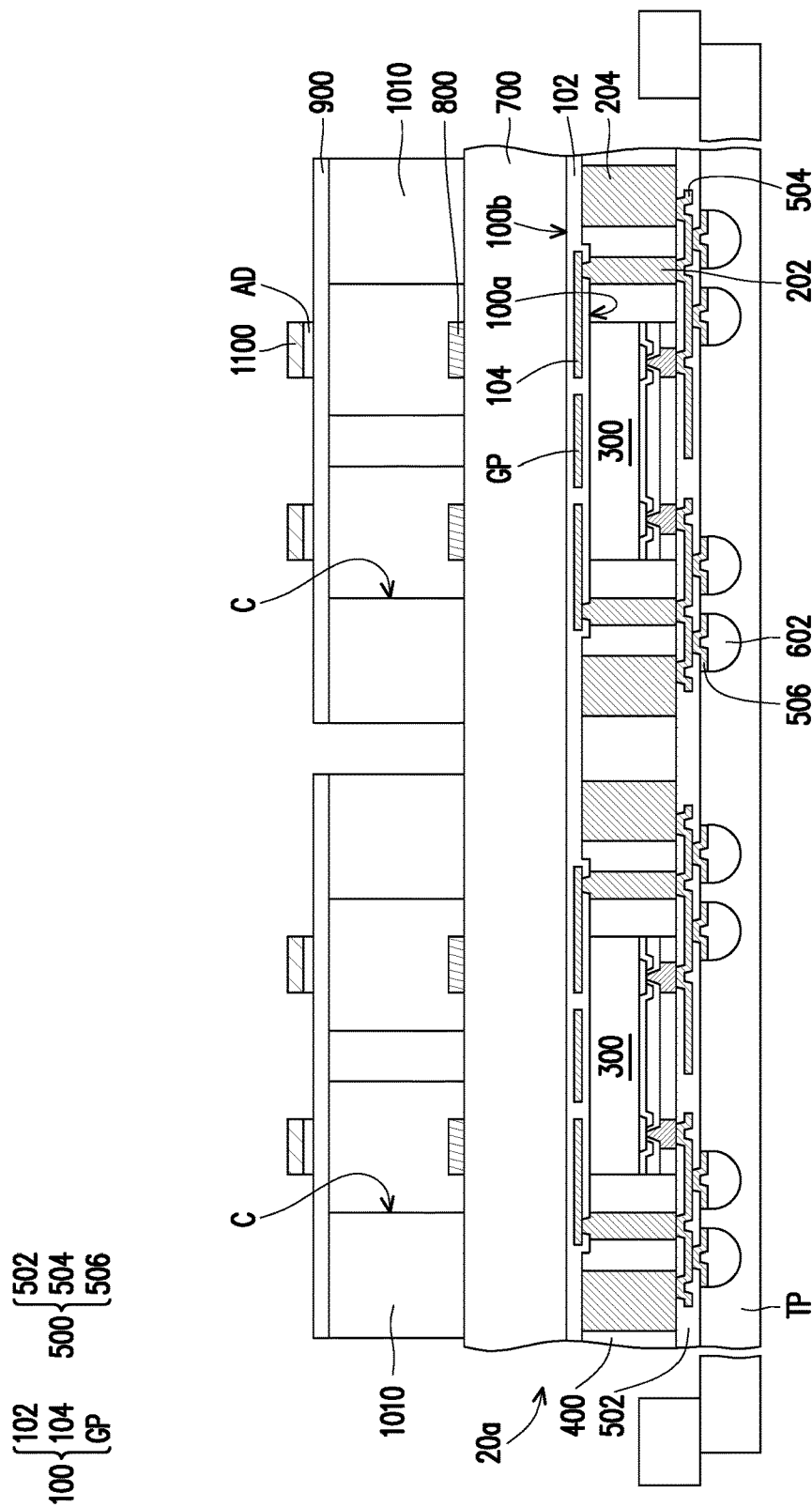

Referring to FIG. 5C, a plurality of conductive patches 1100 are formed on the dielectric layer 900. In some embodiments, the conductive patches 1100 are attached to the dielectric layer 900 through an adhesive layer AD. The conductive patches 1100 and the adhesive layer AD may be formed through the methods similar to the methods illustrated in FIG. 1L to FIG. 1N, FIG. 3A to FIG. 3D, or FIG. 4A to FIG. 4E, so the detailed descriptions thereof are omitted herein.

Figure 5D:
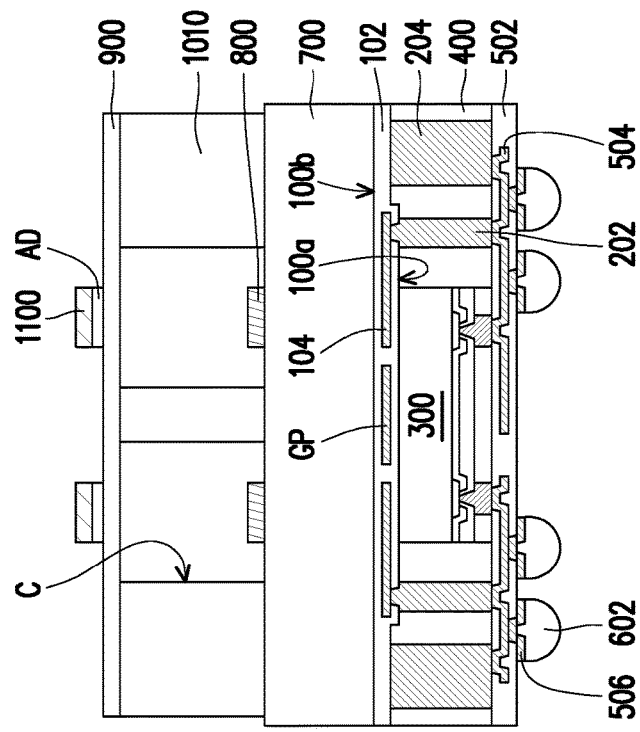

Referring back to FIG. 5D, the tape TP is removed and the structure illustrated in FIG. 5C may undergo a singulation process to form the InFO package 20. For example, a singulation process may be performed on the package array 20a to obtain the InFO package 20. As illustrated in FIG. 5D, the InFO package 20 has dual patch layer (the conductive patches 800 and the conductive patches 1100) configuration. By adapting two patch layers, applications requiring larger bandwidth may be realized. Similar to the core layer 1000 and the dielectric layer 900 in the InFO package 10 illustrated in FIG. 1O, the core patterns 1010 and/or the dielectric layer 900 of the InFO package 20 may also include a vent to enhance the reliability thereof.

In accordance with some embodiments of the disclosure, a method of manufacturing an integrated fan-out (InFO) package includes at least the following steps. A package array is formed. A dielectric layer and a core material layer are sequentially formed on a first carrier. A portion of the core material layer is removed to form a core layer having a plurality of cavities. The first carrier, the dielectric layer, and the core layer are attached onto the package array such that the core layer is located between the dielectric layer and the package array. The first carrier is removed from the dielectric layer. A plurality of first conductive patches is formed on the dielectric layer above the cavities.

In accordance with some embodiments of the disclosure, a method of manufacturing an integrated fan-out (InFO) package includes at least the following steps. A package array is formed. A plurality of core patterns is placed on the package array. Each of the core patterns includes a plurality of cavities. A dielectric layer is formed on the core patterns. A plurality of first conductive patches is formed on the dielectric layer above the cavities.

In accordance with some embodiments of the disclosure, a method of manufacturing an integrated fan-out (InFO) package includes at least the following steps. A package array is formed. A core layer having a plurality of cavities is formed over the package array. A dielectric layer is formed on the core layer. A conductive foil is provided. The conductive foil is punched to form a plurality of first conductive patches. The first conductive patches are attached on the dielectric layer above the cavities.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated fan-out (InFO) package, comprising:
   forming a package array;
   sequentially forming a dielectric layer and a core material layer on a first carrier;
   removing a portion of the core material layer to form a core layer having a plurality of cavities;
   attaching the first carrier, the dielectric layer, and the core layer onto the package array such that the core layer is located between the dielectric layer and the package array;
   removing the first carrier from the dielectric layer; and
   forming a plurality of first conductive patches on the dielectric layer above the plurality of cavities.

2. The method according to claim 1, further comprising:
   singulating the package array, the dielectric layer, and the core layer.

3. The method according to claim 1, wherein the portion of the core material layer is removed by a punching process or a photolithography process.

4. The method according to claim 1, wherein the step of forming the package array comprises:
   providing a second carrier;
   forming a first redistribution structure over the second carrier;
   forming a plurality of through interlayer vias (TIV) and a plurality of dies over the first redistribution structure;
   forming an encapsulant encapsulating the plurality of dies and the plurality of TIVs;
   forming a second redistribution structure over the plurality of dies, the plurality of TIVs, and the encapsulant;
   forming an insulating layer over the first redistribution structure opposite to the plurality of dies.

5. The method according to claim 4, wherein the step of forming the package array further comprises:
   forming a plurality of second conductive patches over the insulating layer, wherein the plurality of second conductive patches are located inside of the plurality of cavities of the core layer.

6. The method according to claim 1, further comprising:
   forming a vent in the core layer.

7. The method according to claim 1, further comprising:
   forming a vent in the dielectric layer.

8. A method of manufacturing an integrated fan-out (InFO) package, comprising:
   forming a package array;
   placing a plurality of core patterns on the package array, wherein each of the plurality of core patterns comprises a plurality of cavities;
   forming a dielectric layer on the plurality of core patterns;
   forming a plurality of first conductive patches on the dielectric layer above the plurality of cavities.

9. The method according to claim 8, further comprising:
   singulating the package array.

10. The method according to claim 8, wherein the plurality of cavities of the plurality of core patterns are formed by a punching process or a photolithography process.

11. The method according to claim 8, wherein the plurality of core patterns are placed on the package array through a pick-and-place process.

12. The method according to claim 8, wherein the step of forming the package array comprises:
    providing a carrier;
    forming a first redistribution structure over the carrier;
    forming a plurality of through interlayer vias (TIV) and a plurality of dies over the first redistribution structure;
    forming an encapsulant encapsulating the plurality of dies and the plurality of TIVs;
    forming a second redistribution structure over the plurality of dies, the plurality of TIVs, and the encapsulant;
    forming an insulating layer over the first redistribution structure opposite to the plurality of dies.

13. The method according to claim 12, wherein the step of forming the package array further comprises:
    forming a plurality of second conductive patches over the insulating layer, wherein the plurality of second conductive patches are located inside of the plurality of cavities of the plurality of core patterns.

14. The method according to claim 8, further comprising:
    forming a vent in each of the plurality of core patterns.

15. The method according to claim 8, further comprising:
    forming a vent in the dielectric layer.

16. A method of manufacturing an integrated fan-out (InFO) package, comprising:
    forming a package array;
    forming a core layer having a plurality of cavities over the package array;
    forming a dielectric layer on the core layer;
    providing a conductive foil;
    punching the conductive foil to form a plurality of first conductive patches;
    attaching the plurality of first conductive patches on the dielectric layer above the plurality of cavities.

17. The method according to claim 16, wherein the plurality of first conductive patches are attached to the dielectric layer through an adhesive layer.

18. The method according to claim 16, wherein the step of attaching the plurality of first conductive patches on the dielectric layer comprises:
    placing the plurality of first conductive patches on the dielectric layer through a pick-and-place process.

19. The method according to claim 16, wherein the step of punching the conductive foil and the step of attaching the plurality of first conductive patches on the dielectric layer comprises:

placing the conductive foil on a carrier film;
punching the conductive foil to remove a portion of the conductive foil and to form the plurality of first conductive patches;
attaching the carrier film and the plurality of first conductive patches onto the dielectric layer such that the plurality of first conductive patches are located between the carrier film and the dielectric layer; and
removing the carrier film from the plurality of first conductive patches.

20. The method according to claim 16, wherein the step of attaching the plurality of first conductive patches on the dielectric layer comprises:
providing a stencil over the dielectric layer, wherein the stencil comprises a plurality of apertures exposing the dielectric layer;
distributing the plurality of first conductive patches over the stencil; and
vibrating the plurality of first conductive patches such that the plurality of first conductive patches are driven into the plurality of apertures of the stencil.

\* \* \* \* \*